(12) United States Patent
Ueno

(10) Patent No.: US 10,944,340 B2
(45) Date of Patent: Mar. 9, 2021

(54) POWER GENERATION ELEMENT, METHOD FOR MANUFACTURING POWER GENERATION ELEMENT, AND ACTUATOR

(71) Applicant: NATIONAL UNIVERSITY CORPORATION KANAZAWA UNIVERSITY, Ishikawa (JP)

(72) Inventor: Toshiyuki Ueno, Ishikawa (JP)

(73) Assignee: NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 141 days.

(21) Appl. No.: 16/093,781

(22) PCT Filed: Mar. 3, 2017

(86) PCT No.: PCT/JP2017/008437
§ 371 (c)(1),
(2) Date: Oct. 15, 2018

(87) PCT Pub. No.: WO2017/183325
PCT Pub. Date: Oct. 26, 2017

(65) Prior Publication Data
US 2019/0131892 A1     May 2, 2019

(30) Foreign Application Priority Data
Apr. 19, 2016 (JP) .............................. JP2016-084065

(51) Int. Cl.
*H02N 2/18* (2006.01)
*H01L 41/12* (2006.01)

(52) U.S. Cl.
CPC ........... *H02N 2/186* (2013.01); *H01L 41/125* (2013.01); *H02N 2/18* (2013.01)

(58) Field of Classification Search
CPC ......... H02K 2/186; H02K 2/18; H01L 41/115

USPC .......................................................... 310/26
See application file for complete search history.

(56) References Cited

U.S. PATENT DOCUMENTS

2005/0212364 A1* 9/2005 Ohashi .................... H01L 41/12
310/26
2007/0194647 A1* 8/2007 Maeda ................... H02K 99/20
310/152

(Continued)

FOREIGN PATENT DOCUMENTS

EP      2573931 A1    3/2013
JP    2015-70741 A    4/2015

(Continued)

OTHER PUBLICATIONS

Office Action for corresponding Chinese App. No. PCT/JP2017/008437, dated May 29, 2019.

(Continued)

*Primary Examiner* — Forrest M Phillips
(74) *Attorney, Agent, or Firm* — Renner, Otto, Boisselle & Sklar, LLP

(57) ABSTRACT

A power generation element uses an inverse magnetostrictive effect and includes: a frame yoke made of a magnetic material and having a bent part for forming a closed magnetic circuit, a magnetic part formed in a part of the frame yoke, a magnetostrictive plate made of a magnetostrictive material, a coil, and magnets. The magnetic part has rigidity and geometry for applying a uniform compressive force or tensile force to the magnetostrictive plate and is magnetically saturated by magnetic biases of the magnets. The magnetostrictive plate is attached to the frame yoke so as to be parallel to the magnetic part. The coil is wound around a parallel beam part including the magnetostrictive plate and the magnetic part and/or around the frame yoke. An application of an external force causes the magnetostrictive plate to be extended and compressed and causes the generation of electricity.

15 Claims, 35 Drawing Sheets

(56) References Cited

U.S. PATENT DOCUMENTS

| | | | |
|---|---|---|---|
| 2007/0222433 A1* | 9/2007 | Tiernan | A61B 5/04007 324/207.21 |
| 2013/0140919 A1 | 6/2013 | Ueno | |
| 2014/0097709 A1 | 4/2014 | Ueno et al. | |
| 2014/0333156 A1 | 11/2014 | Toyoda | |
| 2014/0346902 A1* | 11/2014 | Ueno | H01L 41/125 310/26 |
| 2015/0155472 A1 | 6/2015 | Furukawa | |
| 2016/0173006 A1* | 6/2016 | Lee | H01L 41/04 310/317 |
| 2017/0093306 A1 | 3/2017 | Ueno | |

FOREIGN PATENT DOCUMENTS

| | | |
|---|---|---|
| WO | 2011/158473 A1 | 12/2011 |
| WO | 2013/038682 A1 | 3/2013 |
| WO | 2013/136364 A1 | 9/2013 |
| WO | WO-2013136364 A1 * | 9/2013 ............ H02N 2/186 |
| WO | 2014/021197 A1 | 2/2014 |
| WO | 2015/141414 A1 | 4/2017 |

OTHER PUBLICATIONS

International Search Report for corresponding App. No. PCT/JP2017/008437, dated Jun. 27, 2017.

Written Opinion for corresponding App. No. PCT/JP2017/008437, dated Jun. 27, 2017.

Toshiyuki Ueno, "Jiwaishiki Shindo Hatsuden Device no Ryosan Kozo to Kumiageho", National University Corporation Kanazawa University Homepage [online], Feb. 17, 2016.

First Examination Report corresponding Indian application No. 201817042598, dated Sep. 4, 2020.

* cited by examiner

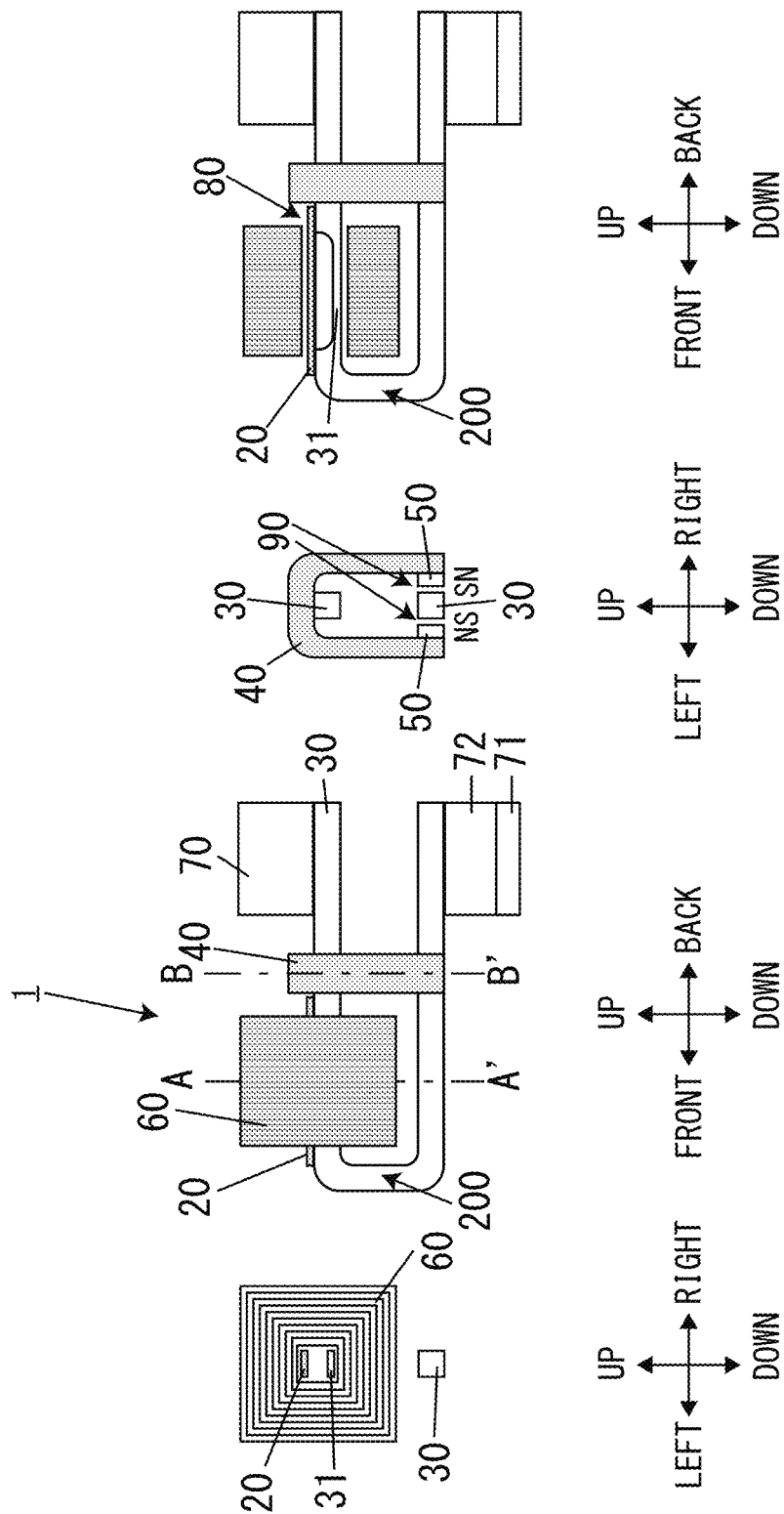

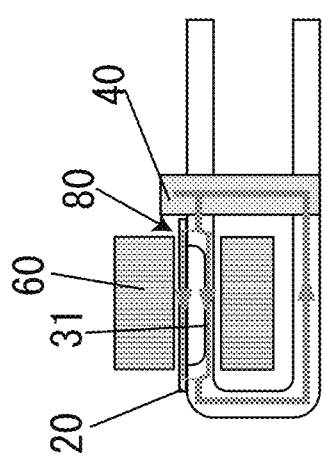
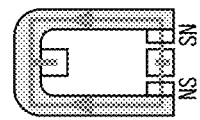
FIG. 2A
FIG. 2B
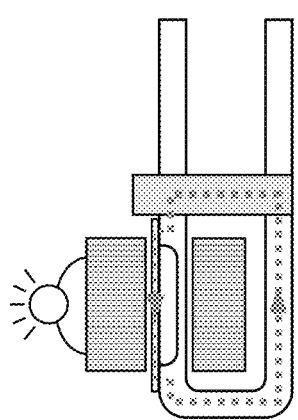
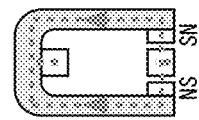
FIG. 2C
FIG. 2D

FIG. 16A
FIG. 16B
FIG. 16C
FIG. 16D
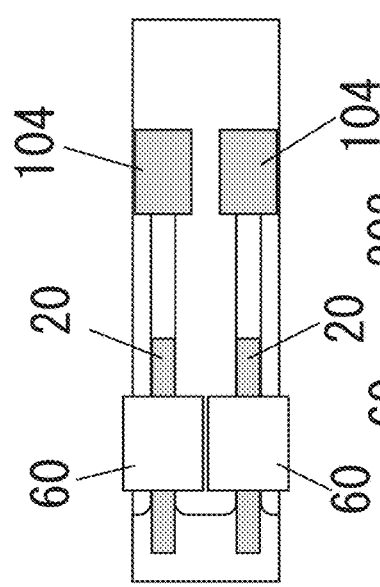
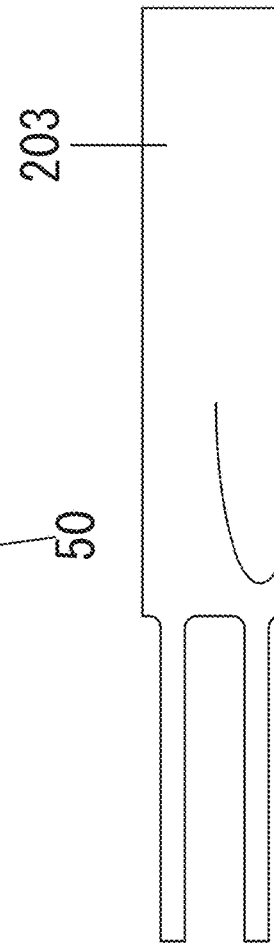
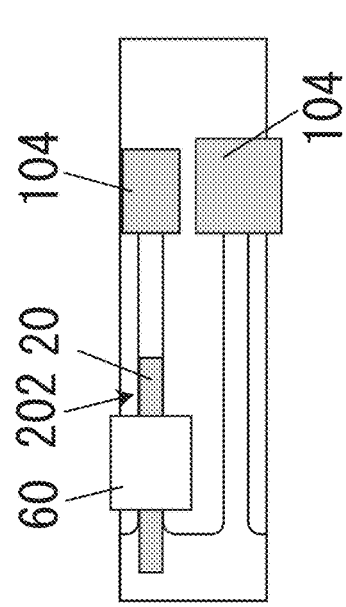

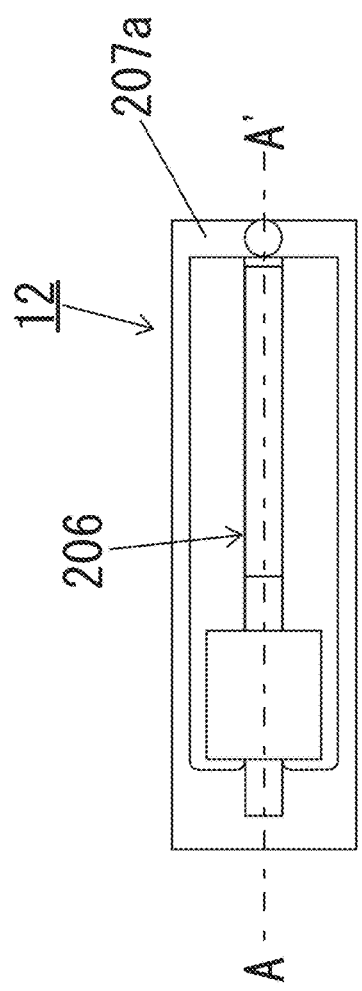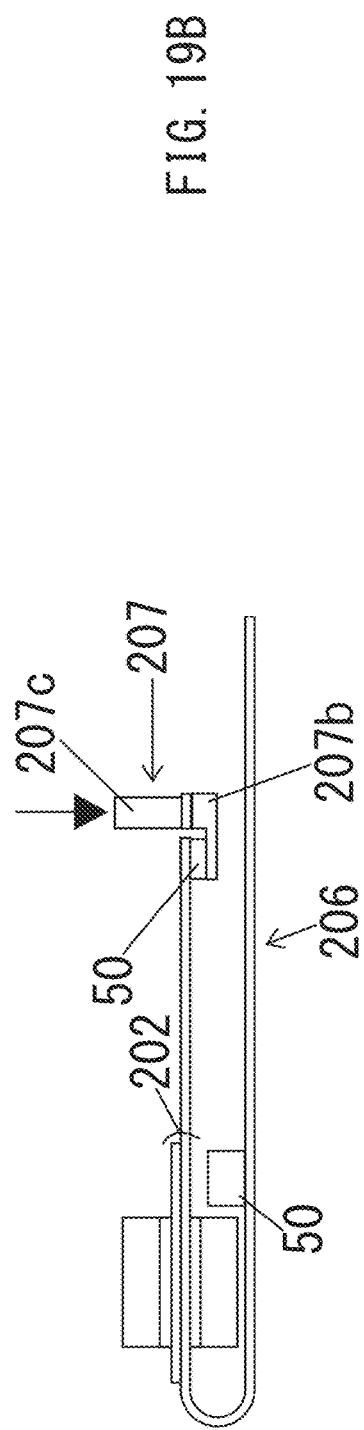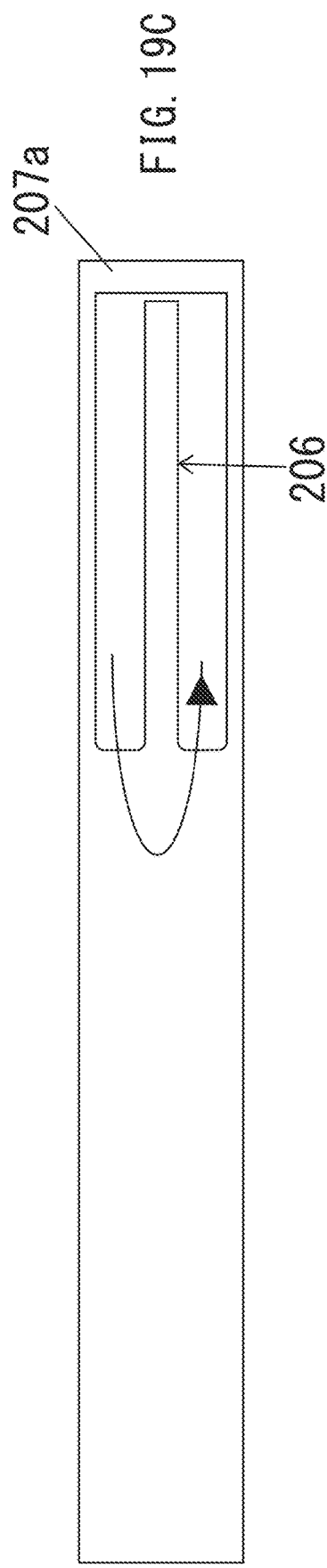

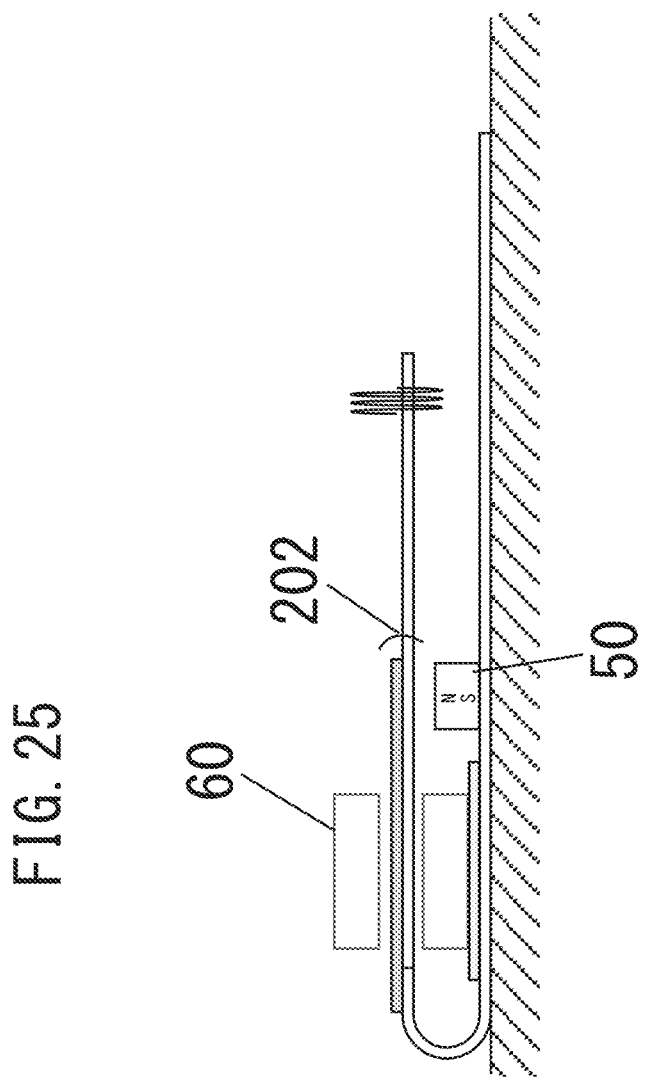

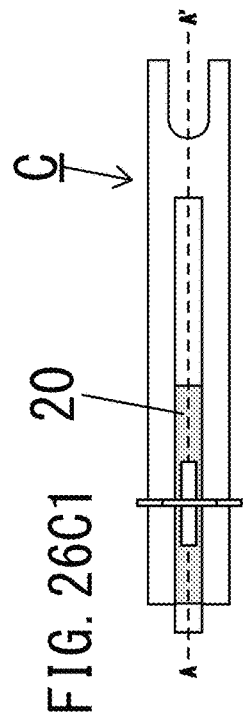
FIG. 26A1
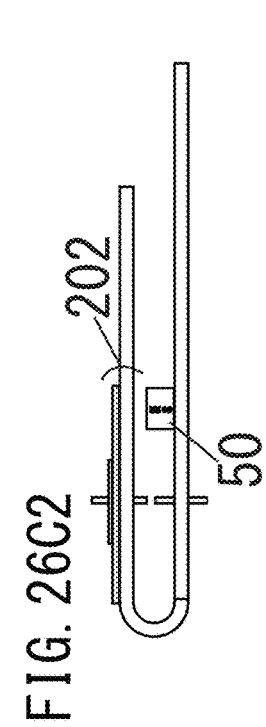
FIG. 26B1
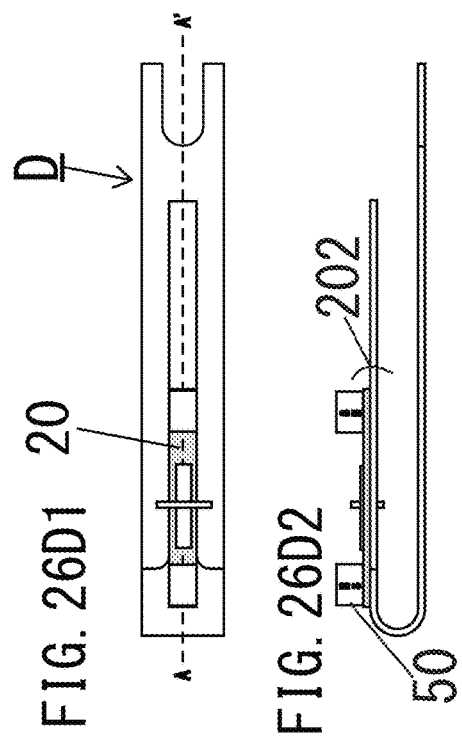
FIG. 26A2
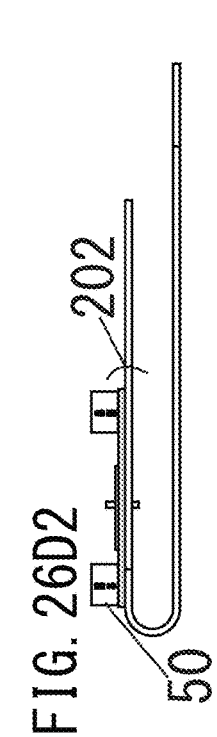
FIG. 26B2
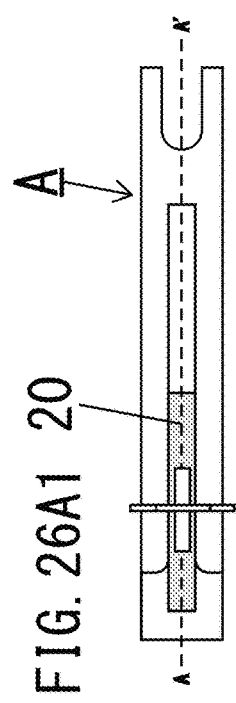
FIG. 26C1
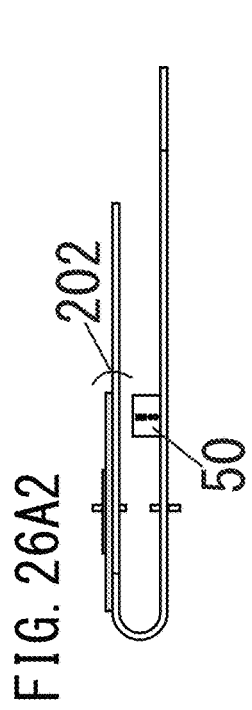
FIG. 26D1
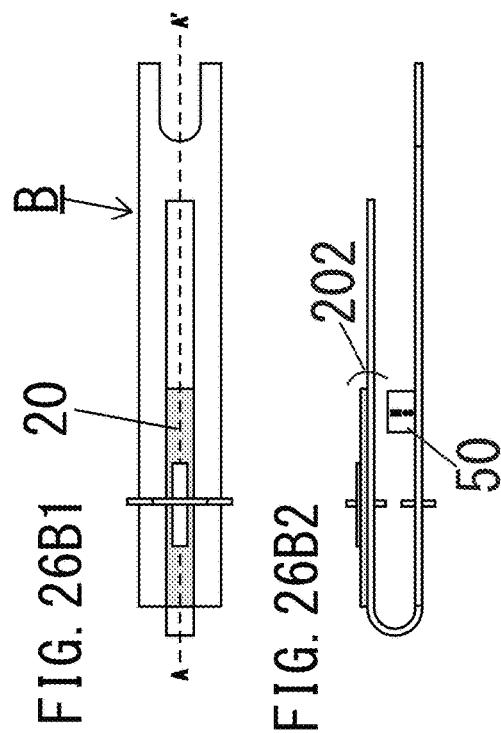
FIG. 26C2
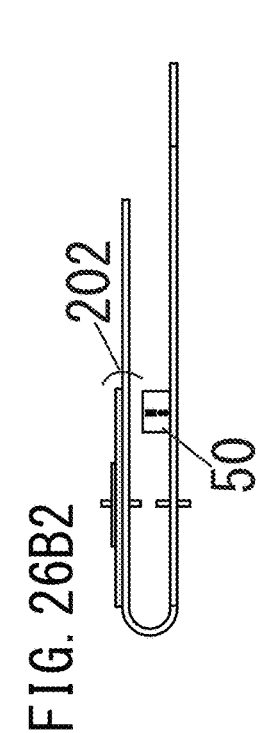
FIG. 26D2

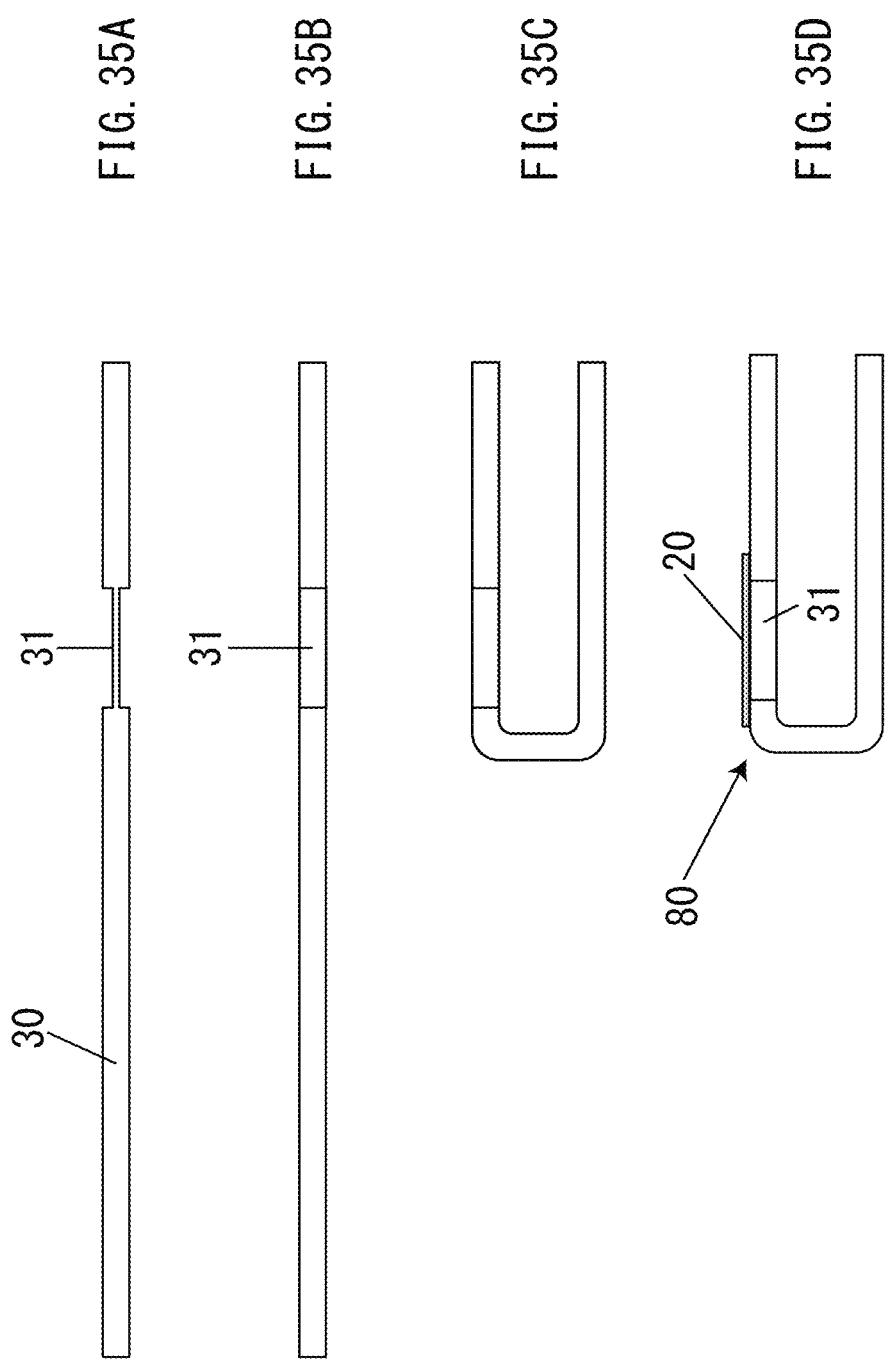

POWER GENERATION ELEMENT, METHOD
FOR MANUFACTURING POWER
GENERATION ELEMENT, AND ACTUATOR

TECHNICAL FIELD

The present invention relates to a power generation element that utilizes an inverse magnetostrictive effect. Specifically, the present invention relates to a power generation element, a method for manufacturing the power generation element, and an actuator, each of which provides an increased electromotive force and allows for decreasing manufacturing cost and mass production.

BACKGROUND

In recent years, technologies for generating electricity by utilizing ordinary vibrations have been developing. One of the technologies utilizes the magnetostrictive effect of a ferromagnetic substance.

The magnetostrictive effect causes a ferromagnetic substance to deform when a magnetic field is applied to the ferromagnetic substance (when the ferromagnetic substance is magnetized). A material that exhibits a large amount of deformation due to the magnetostrictive effect is called a "magnetostrictive material".

The magnetostrictive material also has an inverse magnetostrictive effect, by which the magnetostrictive material is deformed by compressive stress or tensile stress arising inside the magnetostrictive material due to an applied external force, thereby largely varying the magnetization (line of magnetic force). For example, there is a material which the line of magnetic force varies by one tesla (T) or more in response to a compressive force. Attention is increasing for power generation elements that utilize the time variation of magnetic flux caused by the inverse magnetostrictive effect because the power generation elements can efficiently generate electricity even when a small amount of external force is applied (see Patent Documents 1 and 2).

FIG. 33 shows a typical structure of the power generation element that utilizes the inverse magnetostrictive effect.

This power generation element 200 is constituted mainly of a power generation part 201, a frame 202, and a magnet 203.

The power generation part 201 is configured mainly of a magnetostrictive rod 201a made of a magnetostrictive material, a coil 201b that is wound around the magnetostrictive rod 201a, and a magnetic rod 201c that has rigidity and geometry for applying a uniform compressive force or tensile force to the magnetostrictive rod 201a. The magnetic rod 201c is disposed parallel to the magnetostrictive rod 201a.

The frame 202 is made of a magnetic material that is bent in a channel shape. One end part is a fixed end, and the other end part is a free end, with the bent part centered. A recess is formed by cutting out a part of an external surface of the frame 202. The magnetostrictive rod 201a is fitted into this recess and is joined to the frame 202 by soldering, welding, or other method, at both ends of the magnetostrictive rod 201a. The magnet 203 is attached to one internal surface of the frame 202, and a part of the frame 202 thereby functions as a back yoke. The other internal surface of the frame 202, to which the magnet 203 is not attached, and the magnet 203 form a gap 204 therebetween.

By applying an external force to a part of the frame 202, the frame 202 vibrates, and the power generation part 201 generates electricity utilizing the inverse magnetostrictive effect.

CITATION LIST

Patent Literature

Patent Document 1: JP 4905820 B
Patent Document 2: WO 2015/141414

SUMMARY OF INVENTION

Technical Problem

However, the conventional technique previously mentioned has the following problems.

To increase electromotive force (voltage) in the power generation part, one solution is to increase the number of turns of the coil. However, significantly increasing the turns of the coil is difficult because the coil shall be accommodated inside a space surrounded by the magnetostrictive rod and the magnetic rod. One idea for increasing the turns of the coil is to decrease the diameter of a wire of the coil, but the resistance of the coil increases with the decrease in the diameter of the wire.

Moreover, the coating of the coil may dissolve by the rise in temperature when both ends of the magnetostrictive rod are joined to the frame by soldering, welding, or other method.

Further, since the geometry is complicated, such that the recess is formed by cutting out the part of the frame, time-consuming work using wire electric discharge machining or other processing is necessary to manufacture the frame. This is one reason for the increase in the manufacturing cost of the power generation element.

The present invention is made in view of the before-mentioned circumstances, and the object of the present invention is to provide a power generation element using an inverse magnetostrictive effect, a method for manufacturing the power generation element, and an actuator, each of which provides an increased electromotive force and allows for decreasing manufacturing cost and mass production.

Solution to Problem

The power generation element of the present invention relates to a power generation element using an inverse magnetostrictive effect. The power generation element includes a frame yoke made of a magnetic material and having a bent part for forming a closed magnetic circuit, a magnetic part formed in a part of the frame yoke, a magnetostrictive plate made of a magnetostrictive material, a coil, and a magnet. The magnetic part has rigidity and geometry for applying a uniform compressive force or tensile force to the magnetostrictive plate and is magnetically saturated by magnetic biases of the magnets. The magnetostrictive plate is attached to the frame yoke so as to be parallel to the magnetic part. The coil is wound around a parallel beam part including the magnetostrictive plate and the magnetic part and/or around the frame yoke. The magnetostrictive plate is extended and compressed by an applied external force and causes the generation of electricity.

The parallel beam part may include a lamination part that is constituted by laminating the magnetostrictive plates on the surface of the magnetic part.

The power generation element may include a back yoke formed in a channel shape, and another magnet, in addition to the magnet. The magnets may be respectively attached to both ends of the back yoke, and the back yoke may be supported by the frame yoke such that each of the magnets is positioned leaving a gap from the side surface of the frame yoke and that the magnets sandwich the frame yoke therebetween.

The width the frame yoke at a part that is sandwiched by the magnets may be varied spatially, and the distance of the gap varies in accordance with movement of the frame yoke.

The coil may be fixed to the frame yoke on a side of a fixed end such that a gap is maintained between the inside of the empty core of the coil and the parallel beam part.

The frame yoke may be constituted by joining two or more components.

A part of the frame yoke may be narrowed in the width direction and/or thinned in the thickness direction, and the narrowed and/or thinned part is used as the magnetic part.

The magnetic part may have the same width as the magnetostrictive plate. A part of the frame yoke, which is other than the magnetic part and functions as a magnetic path of the closed magnetic circuit, may have two times or more of the width of the magnetic part.

The frame yoke may include two or more free ends and the fixed end. The parallel beam part may be provided in a side of each of the one or more free ends.

The magnet may be an electromagnet.

The power generation element may include a switch mechanism for applying an external force that is provided on a part of the frame yoke.

The method for manufacturing the power generation element of the present invention relates to a method for manufacturing the power generation element. In this method, the frame yoke is manufactured by plastic processing.

The frame yoke may be fabricated in a channel shape by bending.

The coil may be fixed after the coil is fitted from an end part of the frame yoke and is moved to the parallel beam part.

The actuator of the present invention relates to an actuator having the same structure as the power generation element. The magnetostrictive plate is extended and compressed by an application of current to the coil, thereby vibrating the free end of the frame yoke.

Advantageous Effects of Invention

In the power generation element of the present invention, the magnetic part is magnetically saturated by a magnetic bias of a magnet. If the power generation element is excited in a state where the magnetic part is not magnetically saturated, the magnetic flux which flows out from the magnetostrictive plate flows into the magnetic part to form a new loop, and the amount of electromotive force is small. The amount of electromotive force can be increased by magnetically saturating the magnetic part because the formation of the new loop is prevented.

FIG. 34 shows a graph of magnetization curves.

This graph shows a relationship between a magnetization curve of an FeGa alloy when no load (stress of 0 MPa), a compressive force (stress of −20 MPa), or a tensile force (stress of 20 MPa) was applied, and a magnetization curve of an SPCC material.

The curves for the case of the compressive force (stress of −20 MPa) and the tensile force (stress of 20 MPa) relate to deformation of the power generation element under vibration caused by an application of an external force. These curves indicate that the magnetic flux density can vary with such a small amount of force.

A SPCC material is a magnetic material and is not a magnetostrictive material. Thus, the magnetization curve does not vary even when stress occurs in the material.

When the magnetostrictive plate of the FeGa alloy in the parallel beam part and the magnetic part of the SPCC material in the frame yoke have the same length, the same magnetic field is applied to the FeGa alloy and the SPCC material by a magnetic bias. For example, when a magnetic field indicated by the dotted line (approximately 3 kA/m) is applied, the magnetic flux density of the FeGa alloy varies (between the two white circles shown in the graph) due to the effect of stress. In contrast, the magnetic part of the SPCC material is hardly effected by the stress as shown by a white square in the graph because the magnetic part of the SPCC material is in the magnetically saturated state, whereby the magnetic flux density slightly varies.

On the other hand, the part other than the magnetic part in the frame yoke is in a state indicated by a black square in the graph, indicating that this part is not in the magnetically saturated state and has a function of passing the variation of the magnetic flux. This is because this part has two times or more of the width compared with the magnetostrictive plate and the magnetic part (parallel beam part).

In this specification, the "magnetically saturated state" of the magnetic part represents a state where the variation in the magnetic flux of the magnetic part is very small compared with the variation in the magnetic flux of the magnetostrictive plate under vibration (for example, 10% or less), which is indicated by a dotted-line circle in the drawing.

As previously discussed, in the conventional power generation element, since the coil is wound only around the magnetostrictive rod (magnetostrictive plate), the coil shall be accommodated inside the space surrounded by the magnetostrictive rod and the magnetic rod.

On the other hand, in the power generation element of the present invention, the coil is wound around the parallel beam part and the frame yoke. Thus, there is no restriction for the thickness of the coil, and the number of turns of the coil can be significantly increased. Further, a coil having a large wire diameter can be used. Thus, the resistance of the coil can be minutely produced while the electromotive force is increased.

As just mentioned, in the conventional power generation element, a coil having an empty core is fitted to the magnetostrictive rod, and then both ends of the magnetostrictive rod are joined to the frame yoke by welding or other method. This can cause melting of the cover of the coil.

On the other hand, in the power generation element of the present invention, a coil can be wound around the parallel beam part by fitting the coil having an empty core from the tip part of the frame yoke and moving the coil to the parallel beam part, after both ends of the magnetostrictive plate are joined to the frame yoke. Thus, melting of the cover of the coil by heat does not occur. This allows for reducing the manufacturing cost of the power generation element and mass production.

In particular, in the parallel beam part, by employing a lamination part formed by laminating the magnetostrictive plate on the surface of the magnetic part, the magnetostrictive plate can be firmly fixed to the frame yoke (magnetic part). Compared with the case where both ends of the magnetostrictive plate are joined to the frame yoke, when the lamination part is employed, stress does not concentrate on both ends of the magnetostrictive plate, and the parallel beam part does not show irregular deformation under vibration, whereby vibrations are easily generated.

A channel-shaped back yoke can be employed, and each magnet that is attached to each of the end parts of the back yoke can be positioned leaving a gap from the side surface of the frame yoke so that the magnets sandwich the frame yoke therebetween.

If the magnet is displaced on the inner surface side of the frame yoke, the frame yoke deforms at the time of vibration because the frame yoke is pulled by the magnetic force, and the gap between the magnet and the frame yoke may be lost (the magnet may contact the frame yoke).

In view of this situation, a magnet that is attached on each of the end parts of the channel-shaped back yoke is used so as to provide a gap between the side surface of the frame yoke and the magnet. This prevents the magnets from contacting the frame yoke at the time of vibration.

When the back yoke is formed in the channel shape, deformation of the back yoke can be reduced, and the gaps can be designed smaller, by increasing the thickness of the back yoke to improve rigidity.

Two magnets are arranged on the back yoke so as to sandwich the frame yoke therebetween. This structure allows for cancelling the effect of tensile forces which are generated by the magnetic forces and has a doubled area of the magnetic path, thereby reducing the magnetic resistance by 50 percent.

The part of the frame yoke, which is sandwiched by the two magnets on the back yoke, can be varied in width to enable movement of the back yoke and varying the position of the magnets, thereby varying the width of the gaps.

In this case, the magnetic flux density varies as the width of the gaps vary. This allows for adjusting the magnetic bias of the magnetic part.

The coil may be fixed to the frame yoke on the fixed end side so that the gap will be maintained between the inside of the empty core of the coil and the parallel beam part. This structure prevents the vibrating parallel beam part from interfering with the coil. Thus, the vibration frequency can be increased to boost the generated voltage.

The frame yoke can be constituted by joining two or more components. For example, the frame yoke can be constituted by joining a first component including a fixed end, and a second component including a free end. To facilitate the generation of vibrations, it is desirable that the frame yoke is fabricated with an integral component. However, the bent part tends to crack at the time of the bending of the frame yoke to a channel shape, and other undesirable phenomenon occur, whereby durability may be decreased, and manufacturing cost may be increased. Thus, for the purpose of decreasing the bending to improve durability and reduce manufacturing cost, it is preferable that the frame yoke is divided into multiple components.

In a case where the frame yoke is divided into multiple components, productivity and flexibility of the structure are improved because the coil having an empty core can be fitted from the tip part of each component or the coil can be wound directly around the parallel beam part using a coil winding machine.

In general, to reduce the resistance of the coil, the section of the frame yoke is preferably square-shaped. In a case where the frame yoke is constituted of the first component and the second component, the shapes of the sections of the first component and the second component can be changed in accordance with the functions. For example, the section of the first component, to which the parallel beam part is fabricated, can be formed flat for increasing the amount of the magnetostrictive plate being extended/compressed, whereas the section of the second component to be wound with the coil can be formed square.

In a case where the first component and the second component are joined with a sufficient contacting surface, the function similar to that in the case of fabricating the frame yoke with the integral component is obtained.

The part of the frame yoke can be narrowed in the width direction and/or thinned in the thickness direction. This narrowed and/or thinned part can be used as the magnetic part.

In a typical parallel beam part, which has a gap between the magnetostrictive plate and the magnetic part, separating or cracking can occur due to vibration at the parts joining both ends of the magnetostrictive plate and the frame yoke.

In view of this, in an example of the present invention as shown in FIGS. 35A to 35D, a part of the frame yoke 30 is narrowed in the width direction, while the frame yoke 30 is not thinned in the thickness direction, and the thinned part is used as the magnetic part 31. In this example, the parallel beam part 80 has the magnetostrictive plate 20 that is closely attached to the surface of the magnetic part 31. The cross-sectional shape of the parallel beam part 80 in a plane perpendicular to the longitudinal direction is almost a T-shape. By closely attaching the magnetostrictive plate 20 to the magnetic part 31 to make the cross-section of the parallel beam part 80 in a T-shape, the durability of the parallel beam part 80 is improved.

In the present invention, when the longitudinal direction of the magnetostrictive plate and the longitudinal direction of the magnetic part are parallel, the magnetostrictive plate and the magnetic part are parallel to each other. The part constituted of the magnetostrictive plate and the magnetic part in the parallel state is referred as a "parallel beam part."

The width of the magnetic part is preferably made the same as the width of the magnetostrictive plate, and the width of the frame yoke at a part that is other than the magnetic part and that functions as a magnetic path of the closed magnetic circuit, is preferably two times or more of the width of the magnetic part.

In the present invention, the magnetic part is magnetically saturated by a magnetic bias of the magnet, while the magnetostrictive plate, the coil, and the frame yoke excluding the magnetic part are not magnetically saturated. In other words, the parts functioning as the magnetic path are made to have two times or more of the width of the magnetic part to prevent these parts from being magnetically saturated.

The frame yoke can have two or more free ends and one fixed end, and the parallel beam part can be provided in each of the one or more free end sides. In this case, the geometry of the frame yoke is similar to that of a tuning fork. Since the two free ends deform at the same phase at the time of vibration, the vibration lasts.

As the magnet, not only a permanent magnet, but also an electromagnet can be used. The amount of the magnetic bias of the magnetic part can be adjusted by adjusting the current applied to the coil of the electromagnet.

When the power generation element is increased in size, it is difficult to use a permanent magnet of a neodymium iron boron type. A large-size permanent magnet is expensive and is accompanied by difficulty in assembling because of its strong magnetic force. From this point of view, the electromagnet is suitable for a large-size power generation element.

In a case where a switch mechanism is used for applying an external force to a part of the frame yoke, an operation to the switch mechanism allows causing vibration in the frame yoke to generate electricity, even when the power generation element is not fixed to a vibration source or other component.

In the method for manufacturing the power generation element, the frame yoke can be manufactured by plastic processing. As the plastic processing, well-known methods such as bending or press working can be used.

A metal plate made of a magnetic material can be fabricated so as to have a part which will be the magnetic part. Then, an original form of the frame yoke is punched out from this metal plate using press working or other processing, and then the obtained metal plate is subjected to bending or other processing. Thus, the frame yoke can be easily manufactured. Considering the ease of manufacturing and cost, manufacturing steps are changed as necessary. For example, the magnetic part is formed after the original form of the frame yoke is punched out.

Specifically, in a case where the frame yoke is fabricated in a channel shape by bending, the number of components is reduced, which allows manufacturing a power generation element of high efficiency with fewer manufacturing steps.

The coil having an empty core can be fitted from the tip part of the frame yoke, be moved to the parallel beam part, and be fixed. This method reduces the manufacturing cost compared with the case of winding the coil around the parallel beam part.

In the power generation element having the previously-described structure, in a case where a current is applied to the coil instead of vibrating the frame yoke, the magnetostrictive plate is extended and compressed by the magnetic field arising from the coil, and the free end of the frame yoke vibrates. Thus, the power generation element can be used as an actuator.

BRIEF DESCRIPTION OF DRAWINGS

FIG. 1A is an A-A' line sectional view, FIG. 1B is a side view, and FIG. 1C is a B-B' line sectional view, of the power generation element of the first embodiment. FIG. 1D is the side view in which a part of the coil is omitted for ease of understanding the structure of the parallel beam part.

FIG. 2A is a side view, and FIG. 2B is a front view, illustrating the flow of the line of magnetic force before vibration. FIG. 2C is a side view, and FIG. 2D is a front view, illustrating the flow of line of magnetic force under vibration.

FIGS. 16A to 16D show a frame yoke. FIG. 16A is a plan view, and FIG. 16B is a side view, showing a state where a free end is provided to each of two positions. FIG. 16C is a plan view before the frame yoke is bent. FIG. 16D is a plan view showing a frame yoke with only one lamination part.

FIG. 19A is a plan view, and FIG. 19B is an A-A' line sectional view, showing the power generation element of the twelfth embodiment. FIG. 19C is a plan view showing the frame yoke before the frame yoke is bent.

FIG. 25 is a side view showing a modified example of the power generation element.

FIG. 26A1 is a plan view, and FIG. 26A2 is an A-A' line sectional view, showing a power generation element in Example 3. FIGS. 26B1, 26C1, and 26D1 are plan views, and FIGS. 26B2, 26C2, and 26D2 are A-A' line sectional views, of the comparative examples of the power generation element.

FIGS. 35A to 35D illustrate a modified example of a frame yoke and a method for manufacturing this frame yoke.

DESCRIPTION OF EMBODIMENTS

First Embodiment

Figure 3A:
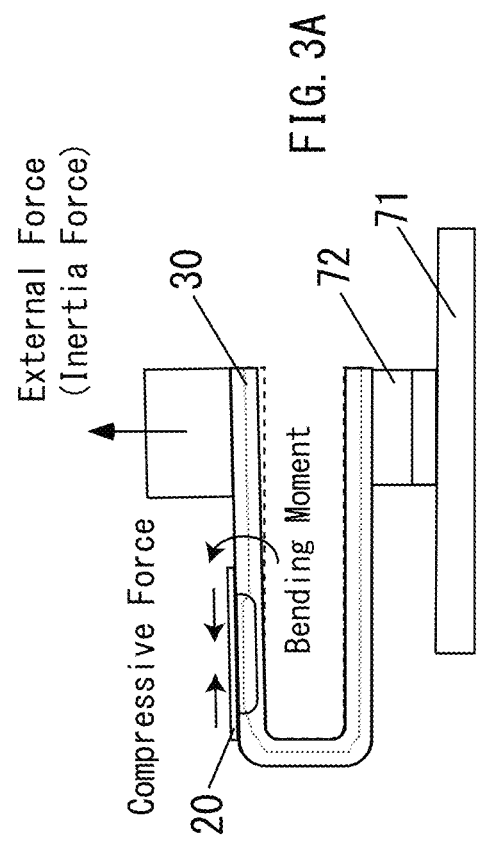
FIG. 3A and FIG. 3B show deformed states of the frame yoke under vibration.

The first embodiment of the power generation element of the present invention will be discussed.

As shown in FIGS. 1A to 1D, a power generation element 1 of the present embodiment is configured mainly of a magnetostrictive plate 20, a frame yoke 30, a magnetic part 31, a back yoke 40, magnets 50, and a coil 60. The power generation element 1 generates electricity utilizing an inverse magnetostrictive effect of the magnetostrictive plate 20 that is extended and compressed by an applied external force. In FIG. 1D, a part of the coil 60 is omitted for ease of understanding the structure of the parallel beam part 80. This also applies to each of the drawings which are hereby discussed.

The magnetostrictive plate 20 is a rod-shaped component including a magnetostrictive material. The magnetostrictive plate 20 preferably includes a magnetostrictive material that has ductility, to enable the magnetostrictive plate 20 to be extended and compressed by an applied external force. The magnetostrictive material shall not be limited to a certain material. It can be an iron-gallium alloy, an iron-cobalt alloy, or a well-known magnetostrictive material such as Fe—Al, or Fe—Si—B alloy, for example. Not only a crystal state material, but an amorphous state material can also be used. To increase a variation of magnetization against tensile stress, a magnetostrictive material that is preliminarily subjected to a stress annealing process for applying compressive stress, can be used. The geometry of the magnetostrictive plate 20 shall be a rod shape, such as a rectangular parallelepiped rod shape.

The magnetostrictive plate 20 is attached to an upper surface of the frame yoke 30 on the free end side by using a well-known method, such as solder bonding, brazing, resistance welding, laser welding, or ultrasonic joining.

The frame yoke 30 includes a bent part 200 and thus has a channel shape as seen from the side, and the frame yoke 30 is made of a magnetic material. A carbon steel (SS400, SC, SK material) or a ferrite based stainless steel (SUS430) can be used as the magnetic material for the frame yoke 30.

The frame yoke 30 is fixed and supported in a similar manner as in a cantilever. That is, the longitudinal direction (front-back direction) thereof is oriented in a substantially horizontal direction, and one end part is fixed, whereas the other end part is made free, with the bent part 200 centered. In the present invention, the "channel shape" includes: "U-shape", in which the frame yoke 30 is bent smoothly from the free end side toward the fixed end side, and "V-shape", in which the interval between the free end side and the fixed end side is gradually widened to the tip part on the free end side and the tip part on the fixed end side from the bent part.

The frame yoke 30 on the free end side is attached with a balance or a vibration plate 70 or both for adjusting a resonance frequency. The frame yoke 30 on the fixed end side is attached with metal fittings 72 for fixing the power generation element to a vibration source 71.

The magnetic part 31 is a part of the frame yoke 30 and is formed at a position parallel to the magnetostrictive plate 20. The magnetic part 31 and the magnetostrictive plate 20 constitute the parallel beam part 80.

In this embodiment, the magnetic part 31 is formed by thinning a part of the frame yoke 30 on the free end side in the thickness direction (up-down direction). As previously discussed, since the frame yoke 30 is made of a magnetic material, the magnetic part 31 also includes a magnetic material.

The magnetic part 31 has rigidity and geometry such that the magnetic part 31 can apply a uniform compressive force or a tensile force to a section of the magnetostrictive plate 20 when an external force is applied to the frame yoke 30. That is, when this parallel beam part 80 is bent by an applied external force, a neutral axis (the axis that is not extended and compressed when the stress is zero) shall be located outside the section of the magnetostrictive plate 20. The rigidity and geometry of the magnetic part 31 are designed to meet this requirement.

The magnetic part 31 is maintained in a magnetically saturated state by magnetic biases of the magnets 50, which will be mentioned later. The detailed explanations of the magnetic part 31 will also be discussed later.

The back yoke 40 is made of a magnetic material and is bent in a channel shape as seen from the side, and magnets 50 are attached to parts of the back yoke 40. Similarly to the aforementioned, the "channel shape" of the back yoke 40 also includes the "U-shape" and the "V-shape".

Specifically, as shown in FIG. 1C, the back yoke 40 is fixed (joined), at the inner surface of the bent part thereof, to the upper surface of the frame yoke 30 on the free end side. The inner surface of each end of the back yoke 40 is attached with a magnet 50. The attaching position of each of the magnets 50 is adjusted so that the magnets 50 have the frame yoke 30 therebetween from the left and right, with a gap 90 between the side surface of the frame yoke 30 on the fixed end side and each of the magnets 50.

Preferably, the gap 90 shall be narrowed as much as possible for reducing magnetic resistance, so long as the magnet 50 and the frame yoke 30 do not interfere with each other and do not cause friction at the time of vibration.

The magnets 50 are attached to the back yoke 40 for magnetizing the magnetostrictive plate 20 and magnetizing the magnetic part 31 to the magnetically saturated state. In this embodiment, permanent magnets 50 are used as the magnets 50.

Although detailed explanations will be discussed later, as shown in FIGS. 2A and 2B, lines of magnetic forces (magnetic fluxes) from the magnets 50 on the left and right form one closed magnetic circuit that passes the back yoke 40, the magnetostrictive plate 20, and the magnetic part 31.

The coil 60 is fixed in a state wound around the parallel beam part 80. The coil 60 generates a voltage, according to the principle of electromagnetic induction, in proportion to a time variation of the lines of magnetic forces that pass inside the magnetostrictive plate 20. Although the material of the coil 60 is not limited particularly, a copper wire can be used, for example. The intensity of the voltage can be adjusted by changing the number of turns of the coil 60.

As shown by the solid lines in FIGS. 2A and 2B, the magnetomotive force of the magnet 50 generates a magnetic flux, and the magnetic flux flows into the frame yoke 30, which includes the gap 90, the back yoke 40, and the parallel beam part 80, and returns to the magnet 50 thereby forming a magnetic loop. This applies a magnetic bias to each component.

The magnetostrictive plate 20 constituting the parallel beam part 80 passes a magnetic flux having a moderate magnetic flux density, whereas the magnetic part 31 also constituting the parallel beam part 80 is in the magnetically saturated state. The "moderate magnetic flux density" represents a magnetic flux density that does not cause magnetic saturation, and approximately the half of a saturated magnetic flux density is preferable. For example, in a case of an Fe—Ga alloy, since the saturated magnetic flux density is about 1.5 T, about 0.7 to 0.8 T, which is half thereof, is a preferable moderate magnetic flux density.

Figure 3B:
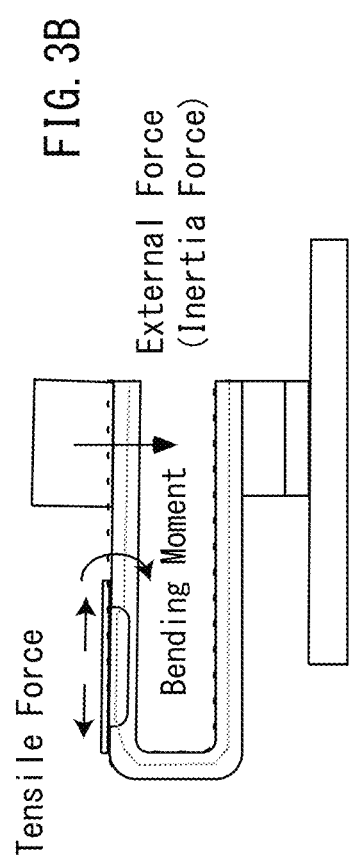

As shown in FIGS. 3A and 3B, when the power generation element 1 is excited by applying an external force, in a state fixed to the vibration source 71 via the metal fittings 72, the balance 70 is applied with an inertia force that is proportional to the mass and vibration acceleration thereof. For example, when the inertia force is in the upward direction, the parallel beam part 80 is bent by a bending moment indicated by an arrow, which is generated by the external force, and the frame yoke 30 deforms such that both end parts open (FIG. 3A). At this time, the neutral axis (where stress is zero) of the parallel beam part 80 is in between the magnetostrictive plate 20 and the magnetic part 31, and as a result, stress inside the magnetostrictive plate 20 is uniform compressive stress. In contrast, when the inertia force is in the downward direction, the frame yoke 30 deforms such that both end parts close by a bending moment indicated by an arrow (FIG. 3B). At this time, stress inside the magnetostrictive plate 20 is uniform tensile stress. As a result, the magnetic flux which flows through the magnetostrictive plate 20 due to the inverse magnetostrictive effect decreases in the former case and increases in the latter case.

The condition for making the stress inside the magnetostrictive plate to be uniform tensile stress or compressive stress is that the neutral axis, in which stress is zero, exists in the gap of the parallel beam part or in the magnetic part.

Regardless of this variation in the magnetic flux, as shown in FIGS. 2C and 2D, almost no variation occurs in the magnetic part 31, and most of the magnetic flux refluxes in a loop that is indicated by a dotted line. The loop passes through the gaps 90, the back yoke 40, the magnetostrictive plate 20, and the frame yoke 30 (excluding the magnetic part 31). The varying magnetic flux does not flow through the magnetic part 31 because the magnetic part 31 has very small magnetic permeability and has large magnetic resistance due to being in the magnetically saturated state.

As a result, variation in the magnetic flux arising in the magnetostrictive plate 20 is equal to variation in an interlinkage magnetic flux of the parallel beam part 80 wound with the coil 60, and an electromotive force (induced voltage or induced current) occurs in the coil 60 in accordance with the time variation of the magnetic flux.

Thus, the prominent feature of the present invention is that the magnetic part 31 is used in a magnetically saturated state. If the power generation element 1 is excited in a state where the magnetic part 31 is not magnetically saturated, the magnetic flux which flows out from the magnetostrictive plate 20 flows into the magnetic part 31 to form a new loop. This reduces the before-mentioned interlinkage magnetic flux and thereby decreases the electromotive force.

In the present invention, the magnetic part is magnetically saturated with the magnetic bias from the magnet. In other words, among the magnetostrictive plate, the back yoke, and the frame yoke, parts other than the magnetic part are inhibited from being magnetically saturated by the magnetic bias from the magnet.

The geometry of the magnetic part 31 shall be designed so that the magnetic part 31 will be magnetically saturated and can apply a uniform compressive stress or tensile stress to the magnetostrictive plate 20 under rated vibration in generating electricity with the power generation element 1. For example, in a case where an Fe—Ga alloy is used as the material of the magnetostrictive plate 20, the magnetic part 31 preferably has approximately 2 mm width in a left-right direction and approximately 0.5 mm thickness in the up-down direction. In a case where SUS430, SS400, or SC50 steel is used as the material of the frame yoke 30, the magnetic part 31 preferably has approximately 2 mm width in the left-right direction and approximately 0.5 mm thickness in the up-down direction, and the parallel beam part 80 (magnetostrictive plate 20 and magnetic part 31) preferably has approximately 7 mm length and a clearance of approximately 1 mm between the magnetostrictive plate 20 and the magnetic part 31.

Next, the method for manufacturing the power generation element of the present embodiment will be discussed with reference to FIGS. 4A to 4G.

Figure 4A:
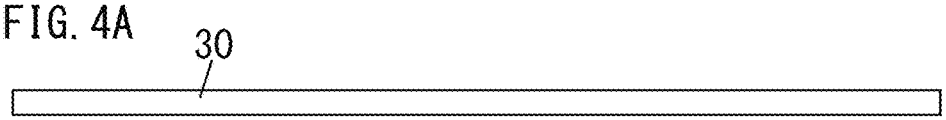
FIGS. 4A to 4G illustrates the method for manufacturing the power generation element.
Figure 4B:

First, a metal plate made of a magnetic material is punched out into a rod-shape by press processing. Here, a thin part that is made by partially cutting off the metal plate is to be used as the magnetic part 31 (FIGS. 4A and 4B).

Figure 4C:
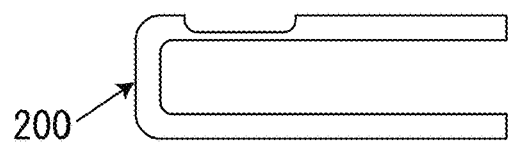

Then, the rod-shaped component is bent near the center to form the frame yoke 30 (FIG. 4C). The bent part of the frame yoke 30 corresponds to the bent part 200.

As necessary, it is preferable that the frame yoke 30 is subjected to a heat process such as annealing, for removing processing strain, recovering elasticity, and increasing tensile strength (spring property) and is then surface treated for rustproofing.

Figure 4D:
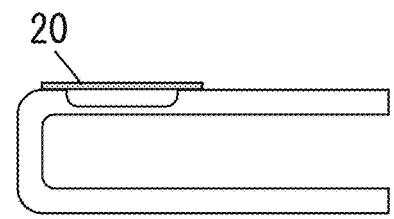

Thereafter, the magnetostrictive plate 20, which is separately produced, is joined near the magnetic part 31 by welding or other method, and rust-proof processing such as plating is performed thereon as necessary, thereby obtaining the parallel beam part 80 (FIG. 4D).

Figure 4E:
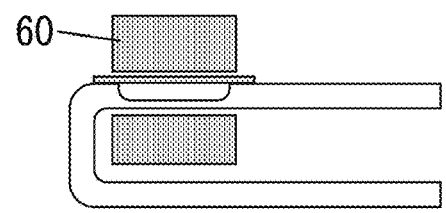
Figure 4F:
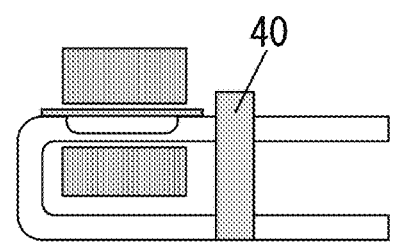
Figure 4G:
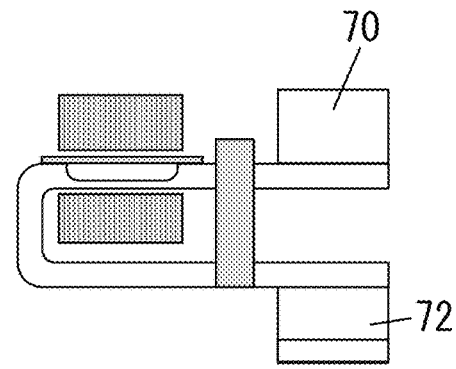

Then, the coil 60 is fitted from the tip part of the frame yoke 30 (FIG. 4E). The channel-shaped back yoke 40 that is attached with two magnets 50 is attached to the frame yoke 30 on the free end side (FIG. 4F). The fixing bracket 72 for the vibration source 71 is attached to the frame yoke 30 on the fixed end side, and the balance 70 or other component is attached to the frame yoke 30 on the free end side as necessary. Thus, the power generation element 1 is completed (FIG. 4G).

As just described, since the coil 60 is wound around the parallel beam part 80 of the power generation element 1 of the present invention, the number of turns of the coil 60 can be increased significantly.

In the present embodiment, the coil 60 is wound around the frame yoke 30 on the free end side; however, the coil 60 can be wound around the frame yoke 30 on the fixed end side or the back yoke 40 for avoiding vibrations. The coil 60 can be wound around both the parallel beam part 80 and the frame yoke 30, both the frame yoke 30 and the back yoke 40, or both the parallel beam part 80 and the back yoke 40. The coil 60 can also be wound around all three of the parallel beam parts 80, the frame yoke 30, and the back yoke 40. This applies to each of the embodiments hereafter, unless otherwise stated.

In the present embodiment, the parallel beam part 80 is provided in the free end side of the frame yoke 30; however, it shall not be limited to this, and the parallel beam part 80 can be provided in the fixed end side.

Second Embodiment

The second embodiment of the power generation element of the present invention will be discussed. Same reference numbers will be assigned to the components that are the same as those in the first embodiment, and detailed descriptions thereof will be omitted.

Figure 5:
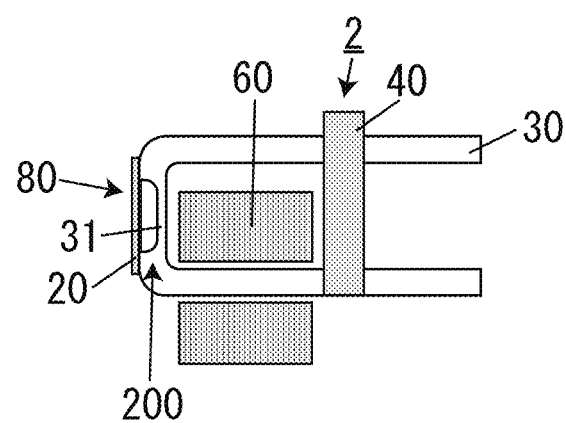
FIG. 5 is a side view showing the power generation element of the second embodiment.

As shown in FIG. 5, a power generation element 2 of the present embodiment is characterized in that the parallel beam part 80 is provided to the bent part 200 of the frame yoke 30.

The magnetostrictive plate 20 of the parallel beam part 80 is attached on the front surface (outer surface) of the bent part of the frame yoke 30, and the magnetic part 31 of the parallel beam part 80 is provided to the rear surface (inner surface) of the bent part of the frame yoke 30.

An external force can be applied to this power generation element 2 at the end part on the free end side. Alternatively, as in the case of the first embodiment, a vibrating object can be attached to the end part on the fixed end side, and an external force can be applied using this vibrating object.

In this embodiment, by providing the parallel beam part 80 to the bent part 200, only the bending moment acts on the parallel beam part 80 at the time of vibration in accordance with a force that acts perpendicular to the longitudinal direction (front-back direction) in the free end side. This increases the power generation efficiency.

Third Embodiment

The third embodiment of the power generation element of the present invention will be discussed. The same reference numbers will be assigned to the components that are the same as those in the embodiments previously discussed, and detailed descriptions thereof will be omitted.

Figure 6:
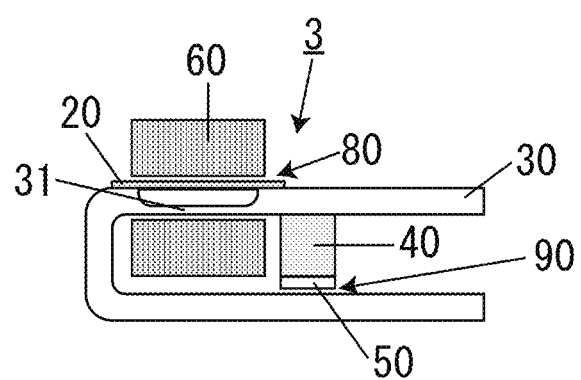
FIG. 6 is a side view showing the power generation element of the third embodiment.

As shown in FIG. 6, a power generation element 3 of the present embodiment is characterized in that: the back yoke 40 is attached to the inner surface of the frame yoke 30 on the free end side, and the magnet 50 is attached to the bottom of the back yoke 40.

In such a structure, while the frame yoke 30 is deformed such that both end parts open, the gap 90 is widened, and the magnetic resistance increases, whereby the magnetic flux density of the magnetostrictive plate 20 decreases. Moreover, as discussed beforehand, the magnetic flux density of the magnetostrictive plate 20 decreases also by compressive stress. In contrast, while the frame yoke 30 is deformed such that both end parts close, the gap 90 is narrowed, and the magnetic resistance decreases, whereby the magnetic flux density of the magnetostrictive plate 20 increases. Moreover, as just discussed, the magnetic flux density of the magnetostrictive plate 20 increases also by tensile stress as discussed beforehand. Thus, a decrease/increase in the magnetic flux density in response to an increase/decrease in the width of the gap 90 occurs in conjunction with a decrease/increase in the magnetic flux density in response to variation in compressive stress/tensile stress arising in the magnetostrictive rod, and therefore, the electromotive force is further increased.

Fourth Embodiment

The fourth embodiment of the power generation element of the present invention will be discussed. The same reference numbers will be assigned to the components that are the same as those in the embodiments discussed above, and detailed descriptions thereof will be omitted.

Figure 7:
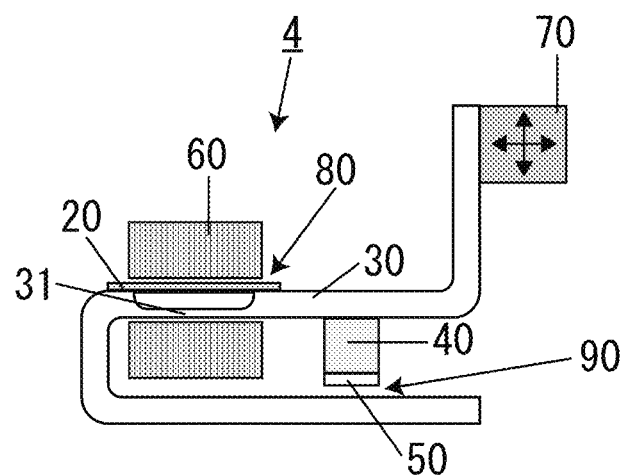
FIG. 7 is a side view showing the power generation element of the fourth embodiment.

As shown in FIG. 7, a power generation element 4 of the present embodiment is characterized in that the end part of the frame yoke 30 on the free end side is bent upward. The bent part can be attached with the balance 70.

The first embodiment previously discussed has a structure that is suitable for a case where an external force acts on the frame yoke 30 on the free end side from the perpendicular direction (up-down direction). On the other hand, the structure in the present embodiment can also cope with a case where an external force acts on the end part on the free end side from the horizontal direction (front-back direction). When an external force acts on the end part on the free end side from the horizontal direction, a bending moment acts on the upwardly bent part. This bending moment causes the entirety of the frame yoke 30 to vibrate, and tensile/compressive stress acts on the magnetostrictive plate 20. The position of the bent part of the end part on the free end side may be set immediately above a fixing support part that fixes and supports the power generation element 4, to make the bending moment and the shearing force arising at the fixing support part minimal and facilitate the generation of vibrations.

Fifth Embodiment

The fifth embodiment of the power generation element of the present invention will be discussed. The same reference numbers will be assigned to the components that are the same as those in the embodiments previously discussed, and detailed descriptions thereof will be omitted.

Figure 8A:
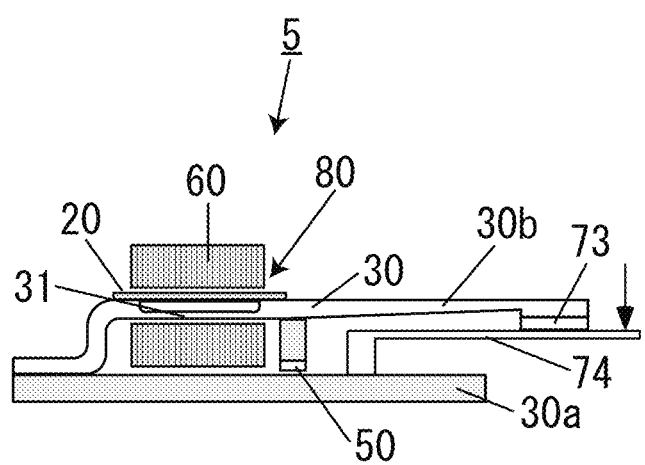
FIG. 8A is a side view showing the power generation element of the fifth embodiment.

As shown in FIG. 8A, in a power generation element 5 of the present embodiment, the frame yoke 30 is constituted by joining a first component 30a that includes a fixed end and a second component 30b that includes a free end together. The power generation element 5 is characterized in that: a magnet 73 is provided on the end part of the second component 30b, which is on the free end side, and a longitudinally extending switch plate 74 is provided on a part of the first component 30a, which is on the fixed end side.

Figure 8B:
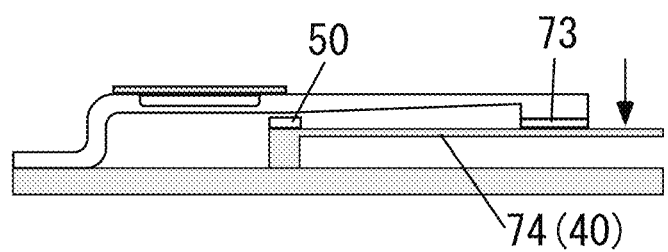
FIG. 8B is a side view of the modified example of the fifth embodiment.

The switch plate 74 is made of a material that is detachable from and attachable to the magnet 73. When the switch plate 74 is pushed down, as indicated by the arrow, from a state where the magnet 73 is magnetically attached to the switch plate 74, this magnetic attachment to the magnet 73 is released. Then, the second component 30b on the free end side rises up and vibrates. This structure allows easily obtaining electric power with this one-click operation to turn on and off the switch. In this structure, the switch plate 74 is a component separated from the power generation element 5. However, as shown in FIG. 8B, the magnet 73 may be attached on a part of the switch plate 74 to utilize the switch plate 74 as the back yoke 40.

Sixth Embodiment

The sixth embodiment of the power generation element of the present invention will be discussed. The same reference numbers will be assigned to the components that are the same as those in the embodiments discussed beforehand, and detailed descriptions thereof will be omitted.

Figure 9A:
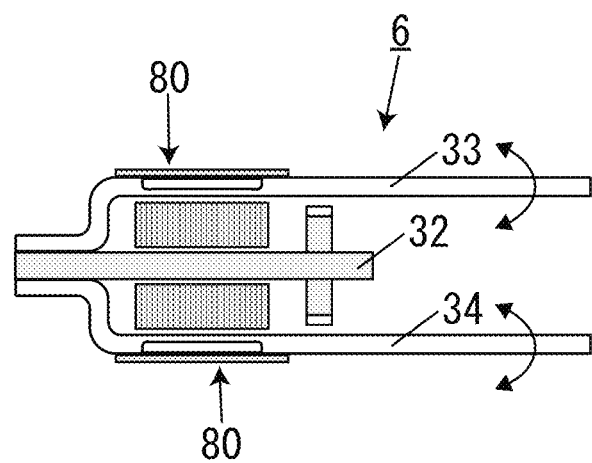
FIG. 9A is a side view showing the power generation element of the sixth embodiment.

As shown in FIG. 9A, a power generation element 6 of the present embodiment is characterized in that: the frame yoke 30 includes two free ends and one fixed end, and the parallel beam part 80 is provided in each of the two free end sides.

Specifically, the frame yoke 30 is constituted by joining a first component 32 that includes the fixed end, a second component 33, and a third component 34 together. The second component 33 and the third component 34 respectively include the free ends. As a whole, the frame yoke 30 has a shape that is similar to a tuning fork. In this case, the two free ends deform at the same phase at the time of vibration, and the vibration is thereby maintained.

Figure 9B:
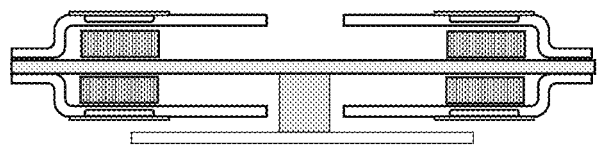
FIG. 9B is a side view of the modified example of the sixth embodiment.

As shown in FIG. 9B, the frame yoke 30 can include two or more free ends (for example, four).

Seventh Embodiment

The seventh embodiment of the power generation element of the present invention will be discussed. The same reference numbers will be assigned to the components that are the same as those in the embodiments previously discussed, and detailed descriptions thereof will be omitted.

Figure 10A:
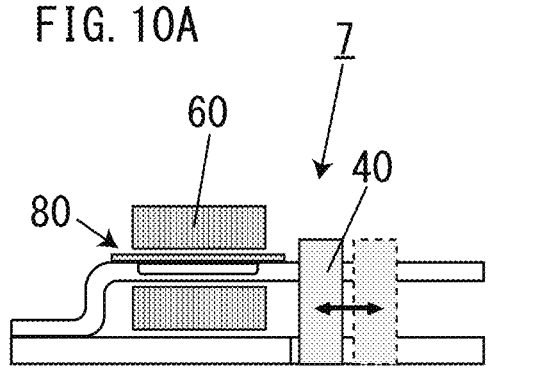
FIG. 10A is a side view.
Figure 10B:
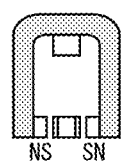
FIG. 10B is a rear view, showing the power generation element of the seventh embodiment.
Figure 10C:
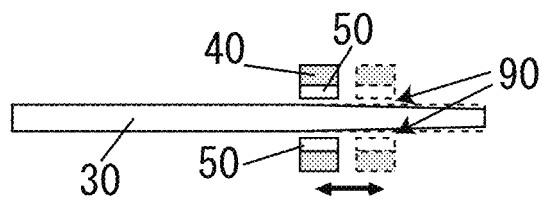
FIG. 10C is a plan view of the frame yoke on the fixed end side.

As shown in FIG. 10A to 10C, a power generation element 7 of the present embodiment is characterized in that: the frame yoke 30 on the fixed end side is narrowed in width to the tip, and the positions of the back yoke 40 and the two magnets 50 are movable.

The mechanism for moving the positions of the back yoke 40 and the magnets 50 is not limited particularly. For example, a protrusion that extends in the left-right direction is provided on the inner surface of the back yoke 40, a groove that extends in the left-right direction is provided in the surface of the frame yoke 30 on the free end side, and the protrusion is fitted into the groove to guide a movement of the back yoke 40 in the left-right direction.

When the back yoke 40 is moved in the left-right direction, the positions of the two magnets 50 move, and the width of the gaps 90 thereby varies. The magnetic flux density varies with variation in the width of the gaps 90, and this is used to adjust the magnetic bias of the magnetic part 31.

Eighth Embodiment

The eighth embodiment of the power generation element of the present invention will be discussed. The same reference numbers will be assigned to the components that are the same as those in the embodiments previously discussed, and detailed descriptions thereof will be omitted.

Figure 11:
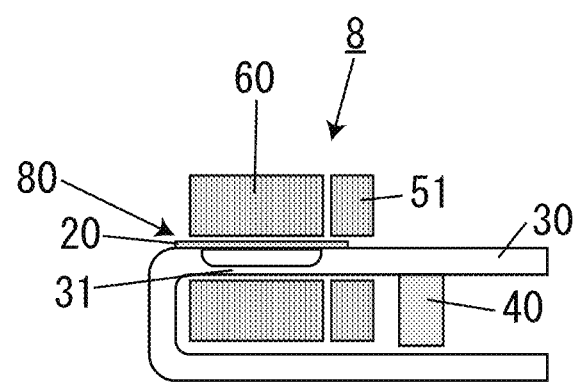
FIG. 11 is a side view showing the power generation element of the eighth embodiment.

As shown in FIG. 11, a power generation element 8 of the present embodiment is characterized in that: an electromagnet 51 is used instead of the magnet 50 that is attached on the back yoke 40 of the power generation element 3 of the third embodiment, and the electromagnet 51 is wound around the free end of the frame yoke 30 in conjunction with the coil 60.

The amount of the magnetic bias of the magnetic part 31 is adjusted by controlling the current that flows through the coil of the electromagnet 51.

Ninth Embodiment

The ninth embodiment of the power generation element of the present invention will be discussed. The same reference numbers will be assigned to the components that are the same as those in the embodiments discussed beforehand, and detailed descriptions thereof will be omitted.

Figure 12:
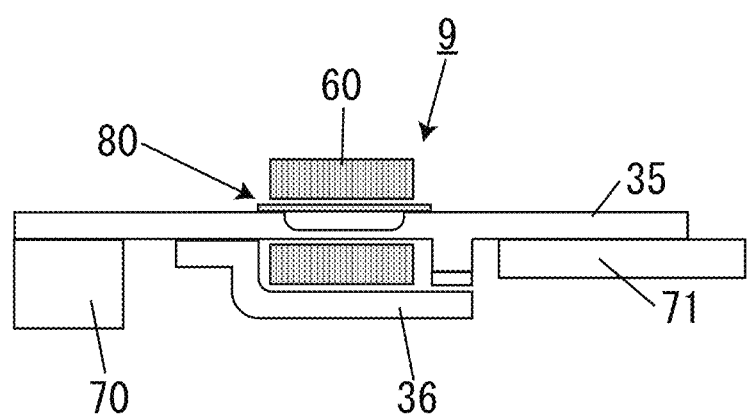
FIG. 12 is a side view showing the power generation element of the ninth embodiment.

As shown in FIG. 12, in a power generation element 9 of the present embodiment, the frame yoke 30 includes a rod-shaped component 35 and a bent component 36.

One end part of the rod-shaped component 35 is attached to the vibration source 71, and the other end part is attached to the balance 70. The parallel beam part 80 is provided on the center of the rod-shaped component 35, and the coil 60 is wound around this parallel beam part 80. The vibration from the vibration source 71 is transmitted to the rod-shaped component 35, and electricity is generated in the parallel beam part 80.

The power generation element 9 of the present embodiment enables adjusting a resonance frequency by the balance 70 and can be treated similarly to an ordinary cantilever beam.

Tenth Embodiment

The tenth embodiment of the power generation element of the present invention will be discussed. The same reference numbers will be assigned to the components that are the same as those in the embodiments previously discussed, and detailed descriptions thereof will be omitted.

Figure 13:
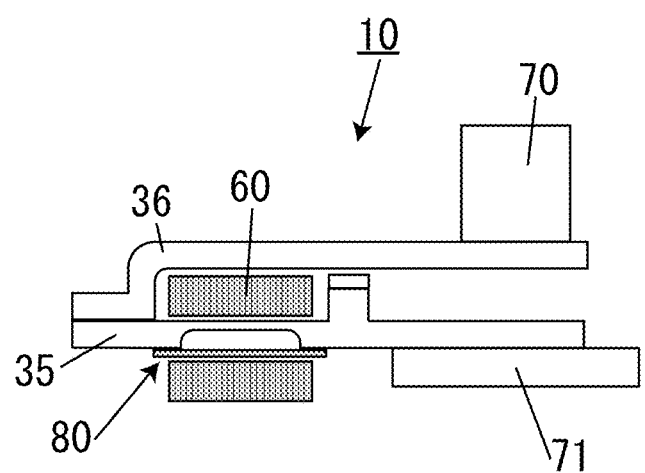
FIG. 13 is a side view showing the power generation element of the tenth embodiment.

As shown in FIG. 13, a power generation element 10 of the present embodiment is characterized in that: the power generation element 9 of the ninth embodiment is inverted, and the balance 70 is attached to an extended end part of the bent component 36.

Eleventh Embodiment

The eleventh embodiment of the power generation element of the present invention will be discussed. The same reference numbers will be assigned to the components that are the same as those in the embodiments discussed beforehand, and detailed descriptions thereof will be omitted.

Figure 14A:
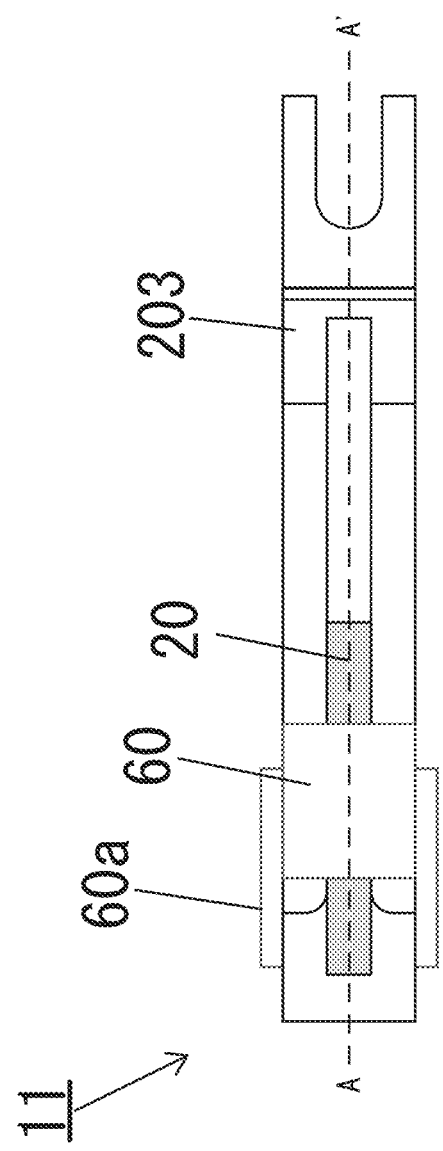
FIG. 14A is a plan view.
Figure 14B:
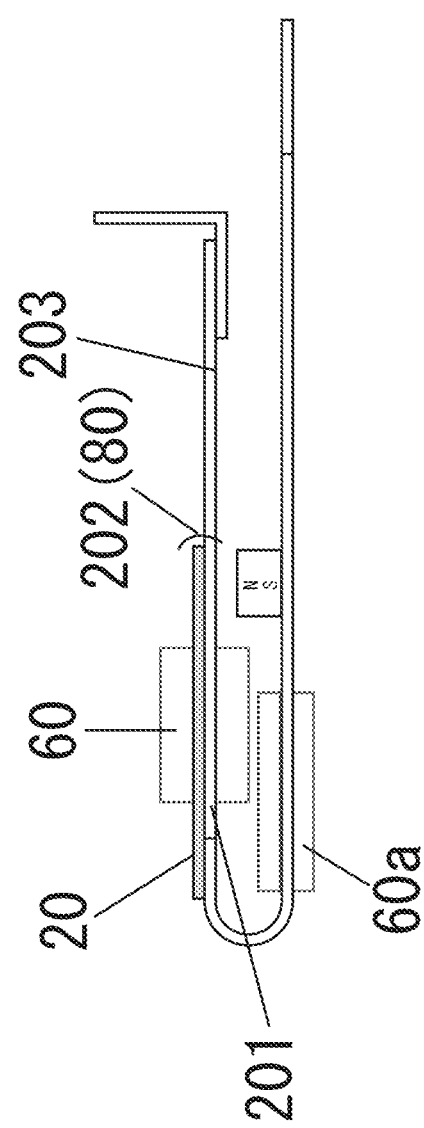
FIG. 14B is a side view, showing the power generation element of the eleventh embodiment.

As shown in FIGS. 14A and 14B, a power generation element 11 of the present embodiment is characterized in that a lamination part 202 is constituted by laminating the magnetostrictive plate 20 on the surface of a magnetic part 201.

That is, in the before-mentioned embodiments, such as the first embodiment, the magnetic part 31 is made by thinning a part of the frame yoke 30 in the thickness direction (up-down direction), whereas, in the present embodiment, a frame yoke 203 is made to have a uniform thickness and have a narrow width part, and a magnetic part 201 is made at the narrow width part. The lamination part 202 is constituted by laminating the magnetostrictive plate 20 on the surface of this magnetic part 201 in parallel to each other. Thus, the lamination part 202 is a subordinate concept of the parallel beam part 80. In other words, the lamination part 202 is included in the parallel beam part 80.

Figure 15:
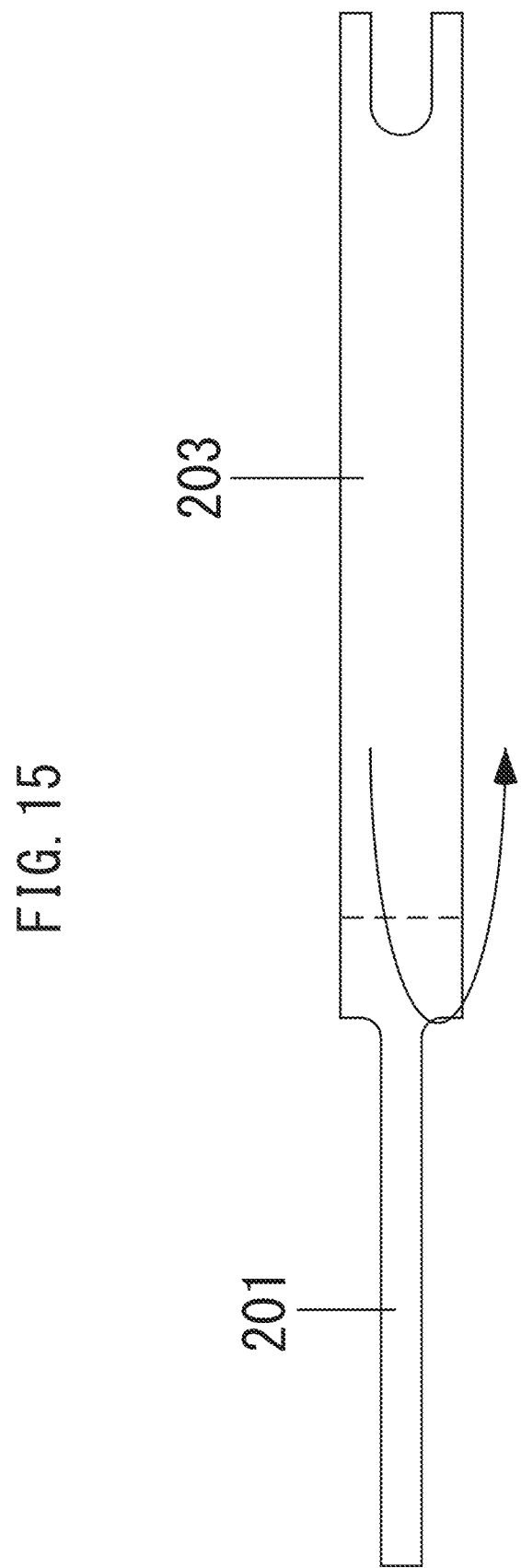
FIG. 15 is a plan view illustrating the method for manufacturing power generation element.

The method for manufacturing this power generation element 11 will be discussed. As shown in FIG. 15, first, a plate material is cut out by a well-known method such as press processing, so that one end part will be narrow. Then, the cut plate material is bent upward at a part indicated by the dotted line to form the frame yoke 203 in a U-shape.

The narrow part serves as the magnetic part 201.

The width of the magnetostrictive plate 20 is equal to the width of the magnetic part 201. The part of the frame yoke 20 is other than that of the magnetic part 201 and it functions as a magnetic path of a closed magnetic circuit which has a width two times or more of the width of the magnetic part 201.

The magnetostrictive plate 20 is fixed on the surface of the magnetic part 201 by using adhesive, by welding, or by other well-known measures to laminate the magnetostrictive plates 20 on the surface of the magnetic part 201.

Then, the coil 60 is fitted from the tip part on the free end side, moved to the position for covering the lamination part 202, and then fixed. The other coil 60a is also fitted from the tip part on the fixed end side, and then the coil 60a is fixed under the lamination part 202. Thus, electricity can be generated at the upper side position and the lower side position. The coil may be provided at either one of the upper side position or the lower side position.

The tip part of the frame yoke 203 on the fixed end side can be formed in a U-shape, and the axis of a bolt (not illustrated) can be inserted therein for fixing the power generation element 11.

In the power generation element 11 of the present embodiment, the layer thickness (number of turns) of the coil 60 can be increased because the coil 60 is provided around the lamination part 202. Moreover, the power generation element 11 enables further reducing the manufacturing cost and mass production because the coils 60 and 60a are provided only by fitting them from the tip part of the frame yoke 203 and moving.

Narrowing the width of the magnetic part 201 relatively compared with the other parts enables the magnetic part 201 to easily be magnetically saturated (enables the magnetic part 201 to hardly pass the magnetic flux) and makes the other parts difficult to magnetically saturate (makes the other parts easily pass the magnetic flux). The width of the frame yoke 30 on the fixed end side is wider than the width of the frame yoke 30 on the free end side, which facilitates fixation using an adhesive or a double-sided tape.

The magnetostrictive plate 20 is laminated on the surface of the magnetic part 201. Thus, compared with the power generation element 1 discussed in the first embodiment, in which merely both end parts of the magnetostrictive plate 20 are attached to the upper surface of the frame yoke 30, the magnetostrictive plate 20 is firmly fixed to the frame yoke 203 (magnetic part 201). In the power generation element 1 of the first embodiment, at the time of vibration, stress concentration may arise at both end parts of the magnetostrictive plate 20, and the magnetostrictive plate 20 may deform in a manner different from that of the magnetic part 31 and show irregular deformation. However, in the power generation element 11 of the present embodiment, stress concentration is difficult to occur, and the magnetostrictive plate 20 tends not to show irregular deformation, resulting in the easy generation of vibration.

As shown in FIGS. 16A to 16C, two free ends may be provided. In this case, a plate material is cut out to make two pieces for the magnetic parts 201. Then, the magnetostrictive plates 20 are respectively laminated on the magnetic parts 201, and the coils 60 are respectively wound thereto. By adjusting the weight of the balance 104 to be attached to the end part on each of the free-end sides, by adjusting the length of the free ends, or by other means, the resonance frequencies of these two free ends may be made different from each other to allow generation of electricity in various frequencies. In one example, three or more free ends may be provided. In another example, as shown in FIG. 16D, only one lamination part 202 may be provided.

Figure 17:
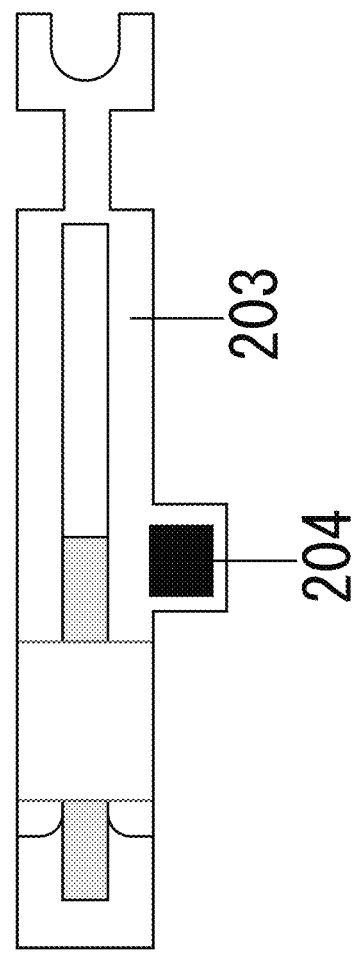
FIG. 17 is a plan view showing a state where a circuit element is provided.

In yet another example, as shown in FIG. 17, when a circuit element 204 is provided to the frame yoke 203 on the fixed end side, or when the power generation element 11 is fixed only at the end part of the frame yoke 203 on the fixed end side, a part of the frame yoke 203 may be narrowed to prevent the dissipation of vibration energy.

Figure 18A:
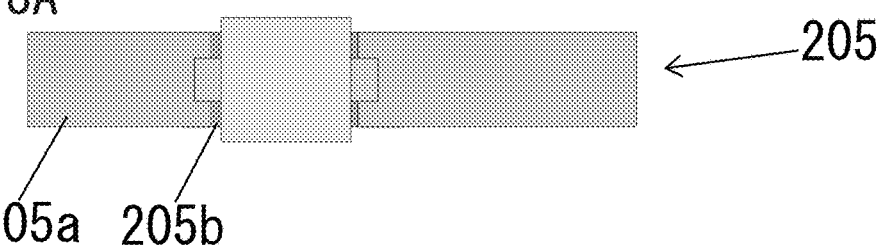
FIG. 18A is a plan view.
Figure 18B:
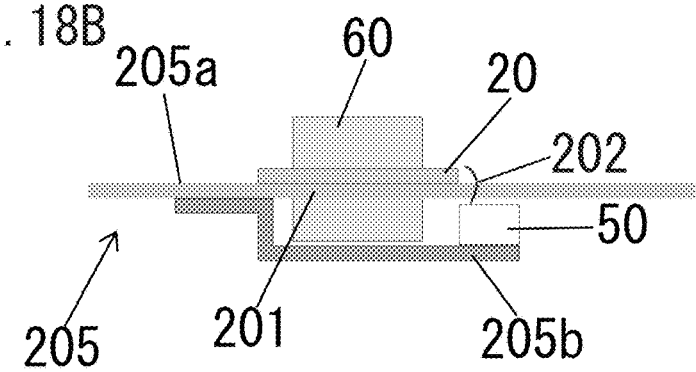
FIG. 18B is a side view, showing a state where the frame yoke is configured of two components: a rod-shaped component, and a bent component.

As shown in FIGS. 18A and 18B, the frame yoke 205 may be constituted of two components: a plate component 205a, and a bent component 205b.

In the plate component 205a, one end part is the free end, the other end part is the fixed end, and a lamination part 202 and the coil 60 are provided in the center.

One end part of the bent part 205b is attached with the magnet 50, and the other end part is fixed in the vicinity of the fixed end of the plate component 205a.

Figure 18C:
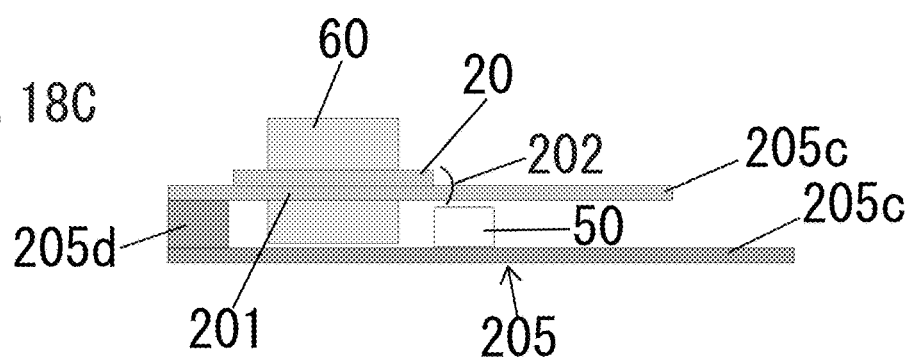
FIG. 18C and 18D are a side view, showing a state where the frame yoke is configured of two components arranged in a vertical direction and a connection part.
Figure 18D:
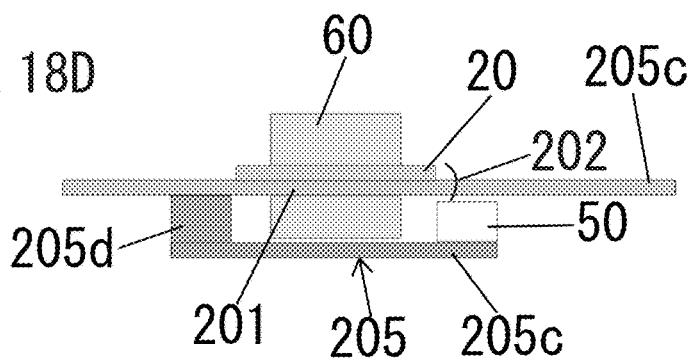
Figure 18E:
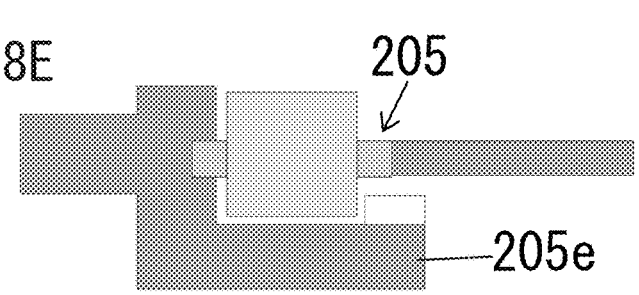
FIG. 18E is a plan view showing the frame yoke constituted using a single plate component, including a bent part.

Besides the aforementioned configurations, as shown FIGS. 18C and 18D, two plate components 205c may be arranged in the vertical direction and be connected by a connection part 205d, and as shown in FIG. 18E, the frame yoke 205 may be constituted by using a single plate component 205e that includes a bent part.

Twelfth Embodiment

The twelfth embodiment of the power generation element of the present invention will be discussed. The same reference numbers will be assigned to the components that are the same as those in the embodiments previously discussed, and detailed descriptions thereof will be omitted.

As shown in FIGS. 19A to 19C, a power generation element 12 of the present embodiment is characterized in that a single plate material functions as a frame yoke 206 and a part of a switch mechanism 207.

Specifically, as shown in FIG. 19C, a channel-shaped piece is cut out from a part of a plate material, thereby forming a free end of the frame yoke 206 and a switch plate 207a. Then, the plate material is bent in a U-shape, and the part excluding the switch plate 207a is used as the frame yoke 206.

As shown in FIGS. 19A and 19B, a yoke 207b is attached to the under surface of the switch plate 207a, and the magnet 50 is attached to a part of the yoke 207b. The magnet 50 is magnetically attached to the free end of the frame yoke 206. The upper surface of the switch plate 207a is attached with an operation part 207c.

When the operation part 207c is pushed down, the free end of the frame yoke 206 is released from the magnet 50 and vibrates freely, resulting in the generation of electricity in the lamination part 202.

Example 1

Figure 20:
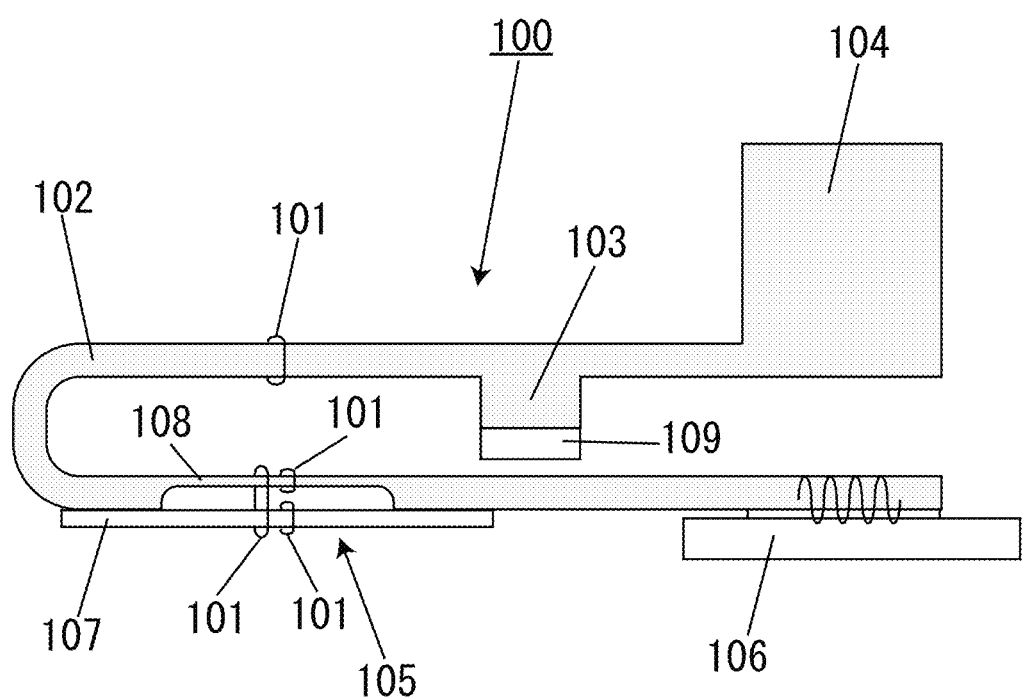
FIG. 20 is a side view showing a power generation element used in Example 1.

In a power generation element 100 shown in FIG. 20, the winding position of a single-turn pickup coil 101 was changed for comparing the generated voltage.

Specifically, a back yoke 103 was attached to the inner surface of a channel-shaped frame yoke 102 on the free end side, and a balance 104 was attached to the end part of the frame yoke 102 on the free end side. A parallel beam part 105 was provided to the frame yoke 102 on the fixed end side, and the end part of the frame yoke 102 on the fixed end side was fixed to a vibration source 106. The pickup coil 101 was wound around each of a magnetostrictive plate 107, a magnetic part 108, the parallel beam part 105 (magnetostrictive plate 107 and magnetic part 108), and the frame yoke 102.

The material and dimensions of each part are as follows:
 magnetostrictive plate 107: iron gallium alloy, 2 mm width, 0.5 mm thickness, and 13 mm length (the joining part at each end is 3 mm, joined to the frame yoke 102 by soldering);
 frame yoke 102: SK2 material (hardened carbon steel, magnetic material), 2 mm width, and 1 mm thickness. The balance 104, the back yoke 103, and the magnetic part 108 were integrally formed;
 magnetic part 108: 2 mm width, and 0.3 mm thickness;
 parallel beam part 105: the distance between the magnetostrictive plate 107 and the magnetic part 108 is 0.7 mm; and magnet 109: neodymium iron boron based permanent magnet, 2 mm width, 3 mm length, and 1 mm thickness. A gap 110 between the magnet 109 and the frame yoke 102 has a distance of 0.5 mm.

When the vibration source 106 is driven at a resonance frequency of 322 Hz, uniform tensile stress and compressive stress arise alternately in the magnetostrictive plate 107, and regular variation in the magnetic flux arises in response to the inverse magnetostrictive effect. The voltage arises in proportion to the time variation of the magnetic flux. Since the generated voltage in the pickup coil 101 corresponds to the time variation of the magnetic flux, the generated voltage (open voltage) can be calculated by multiplying the time variation of the magnetic flux by the number of coil turns.

Figure 21:
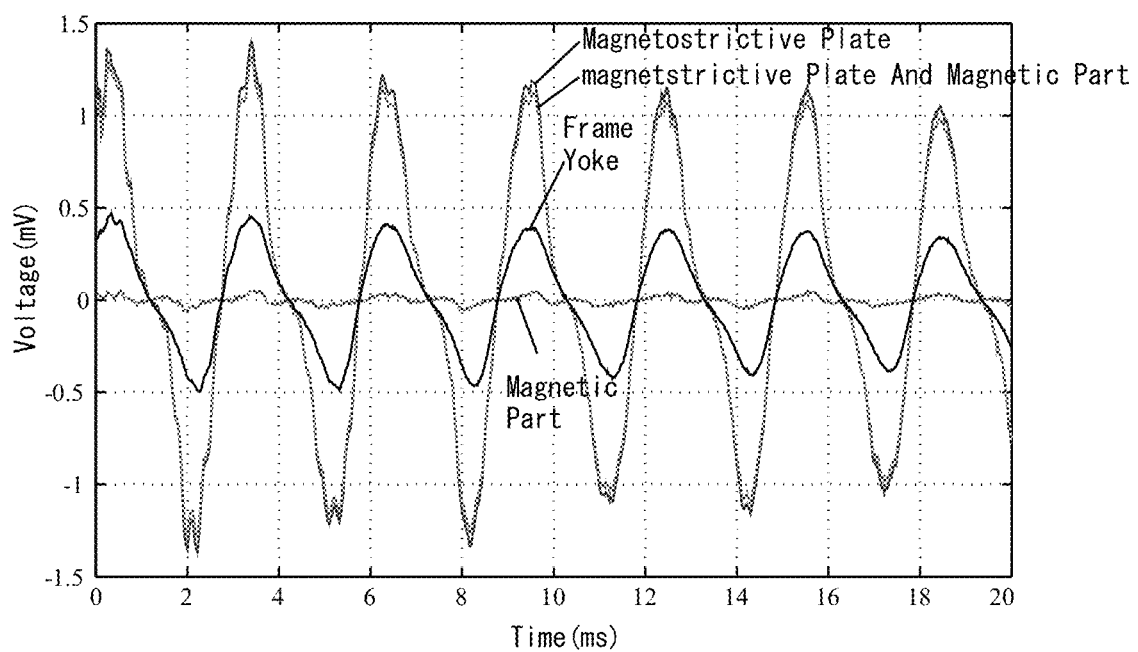
FIG. 21 is a graph showing a voltage distribution.

FIG. 21 shows a voltage distribution.

The voltages of the magnetostrictive plate 107 and the parallel beam part 105 (magnetostrictive plate 107 and magnetic part 108) were almost the same. The voltage of the magnetic part 108 was small. This indicates that the magnetic flux hardly varies because the magnetic part 108 is in the magnetically saturated state. That is, generated voltage in the parallel beam part 105 (magnetostrictive plate 107 and magnetism part 108) and the generated voltage in the magnetostrictive plate 107 are almost the same because the magnetic part 108 is in the magnetically saturated state.

If a coil is wound only around the magnetostrictive plate 107 as in a conventional inverse magnetostrictive power generation element, the thickness of the coil is restricted by the distance of the space in the parallel beam part 105. On the other hand, in the present invention, this restriction is dissolved by winding the coil around the entirety of the parallel beam part 105.

Although the voltage of the frame yoke 102 was expected to be equal to the voltage of the magnetostrictive plate 107, in the structure of this example, the voltage of the frame yoke 102 was smaller than the voltage of the magnetostrictive plate 107. This may be because of magnetic flux leakage. The magnetic flux leakage can be reduced by improving the magnetic circuit.

As discussed beforehand, the parallel beam part 105 that is wound with the coil provides a voltage equivalent to the voltage generated in the magnetostrictive plate 107 wound with the coil, and the frame yoke 102 that is wound with the coil also provides a voltage smaller than the voltage generated in the magnetostrictive plate 107.

Example 2

Figure 22:
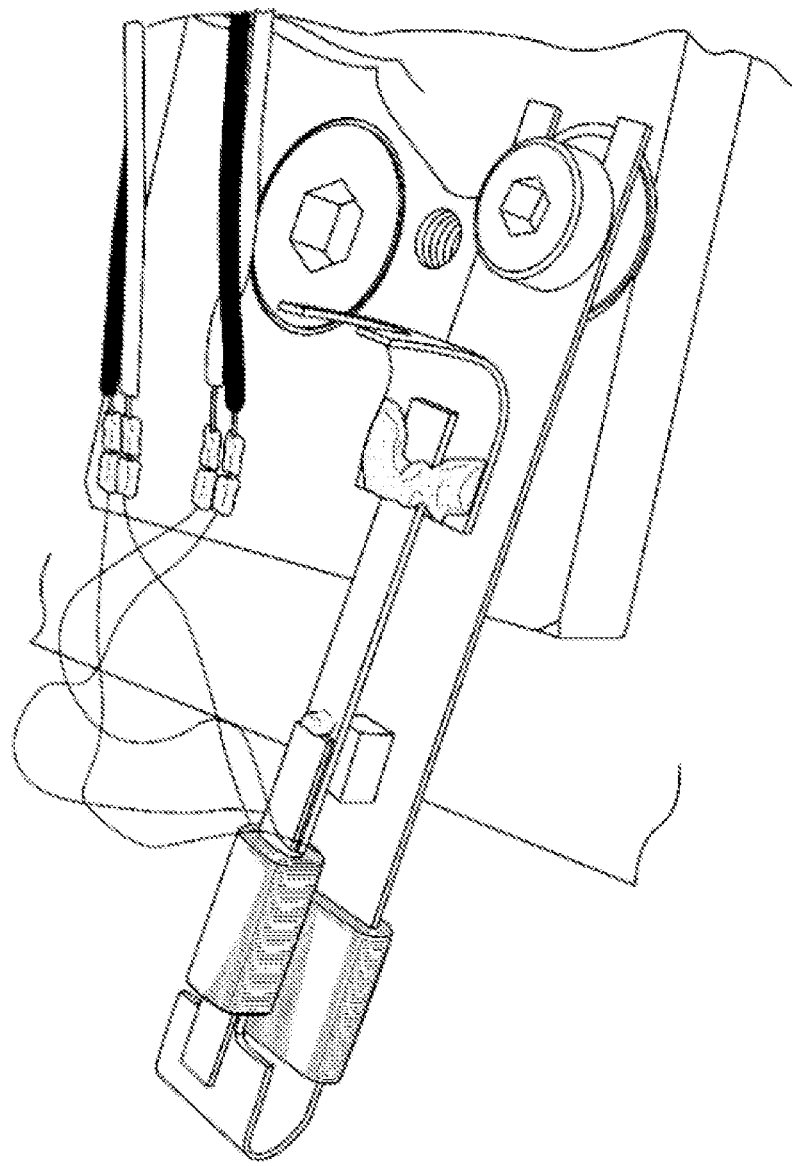
FIG. 22 is an image of a photograph showing a power generation element used in Example 2.
Figure 23:
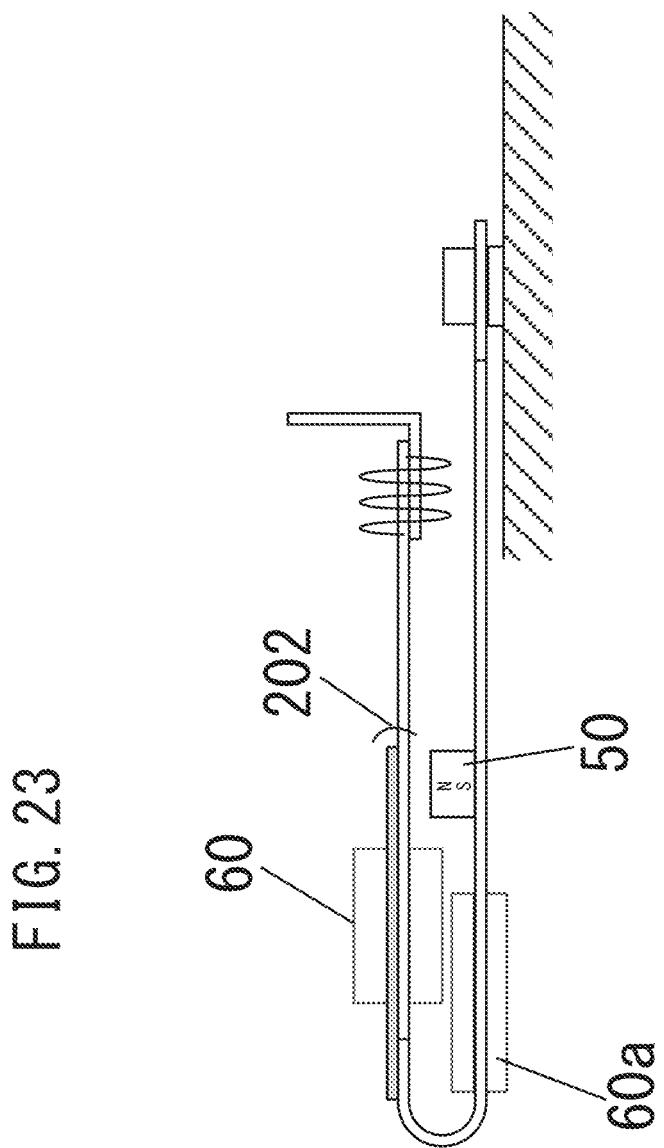
FIG. 23 is a side view showing a power generation element.

As shown in FIG. 22, the power generation element 11 discussed in the eleventh embodiment was manufactured, and the voltages of the upper side coil and the lower side coil were measured. FIG. 23 schematically illustrates the structure of the power generation element of this example.

The frame yoke is U-shaped and was fabricated from a 0.5 mm thickness plate of SPCC (cold-rolled material). The magnetostrictive plate has 2 mm width, 0.5 mm thickness, and 16 mm length. The width of the magnetic part, on which the magnetostrictive plate is laminated, is also 2 mm. The width of the frame yoke, other than the magnetic part, is 6 mm. The upper side coil 60 (coil 1) has 0.05 mm wire diameter, 1 mm layer thickness, and 7 mm length, and the number of turns is 1700. The lower side coil 60 (coil 2) has 0.05 mm wire diameter, 1 mm layer thickness, and 9 mm length, and the number of turns is 1800. The permanent magnet is 2 mm width, 3 mm length, and 2 mm thickness. An L-shaped component was attached on the end part of the frame yoke on the free end side, for attaching a balance.

Figure 24:
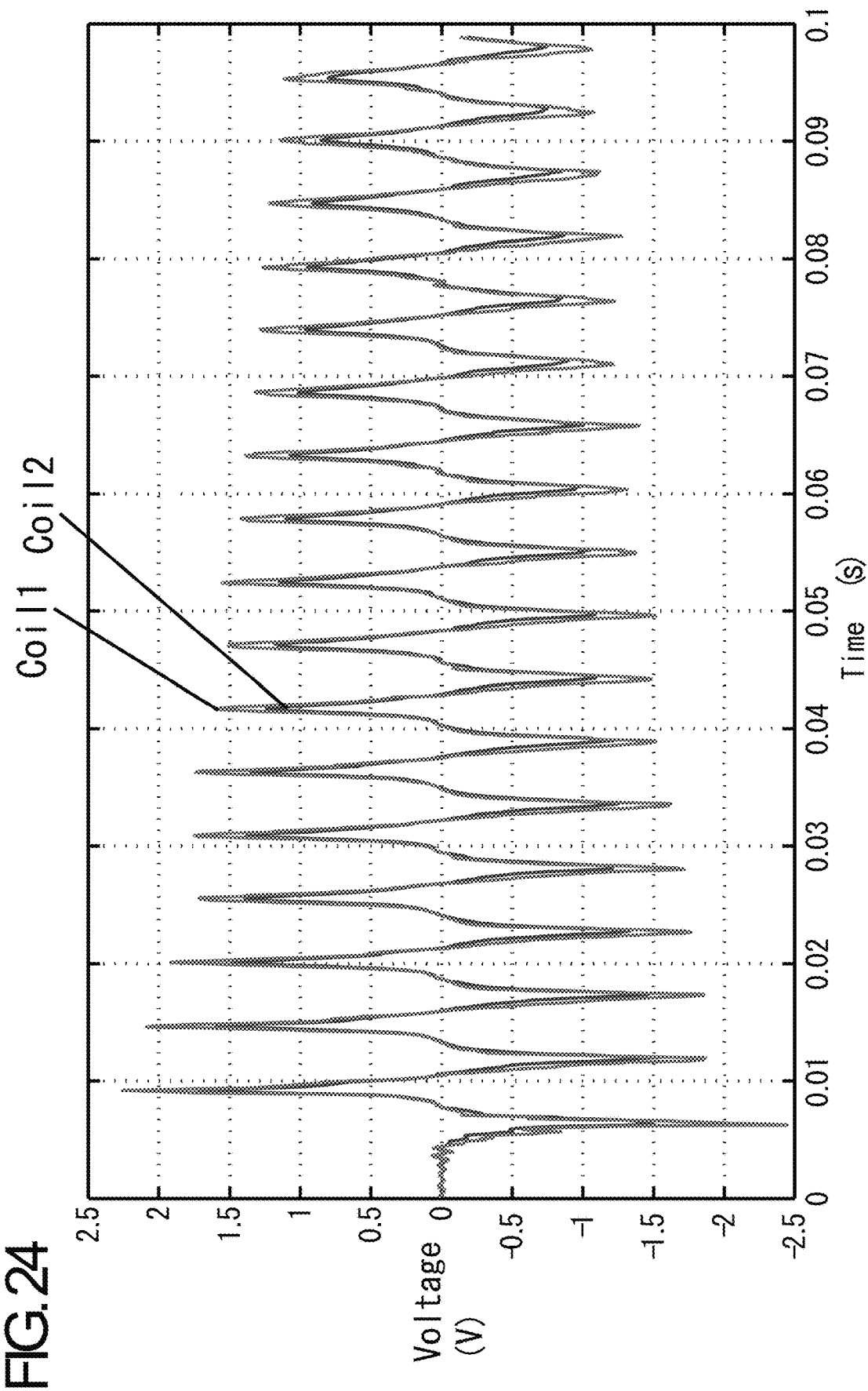
FIG. 24 is a graph showing a relationship between generated voltage and time.

The frame yoke on the fixed end side was fixed with a bolt, the frame yoke on the free end side was flipped to oscillate the frame yoke freely, and the voltage generated was measured. The result is shown in FIG. 24. The frame yoke was vibrated at the frequency of 180 Hz, and a voltage up to approximately 2V was generated in the coil 1. The waveforms of the voltages of the coil 1 and coil 2 were almost the same. The voltage of the coil 2 was smaller than that of the coil 1. This was because of magnetic flux leakage.

As discussed beforehand, the magnetic flux which varies in the magnetostrictive plate flows through the U-shaped frame yoke, thereby generating voltage also in the coil 2, although the voltage is slightly decreased by the magnetic flux leakage.

To increase the generated voltage, the vibration frequency shall be increased. Actually, however, the coil 1 that is wound around the lamination part serves as a weight, and thus the vibrational frequency is difficult to increase. As a solution for this problem, it is preferable to provide a gap between the lamination part 202 and the coil 1 (60) as shown in FIG. 25, to prevent the lamination part 202 from interfering with the coil 1 during vibration (to make the lamination part 202 vibrate inside the empty core of the coil 1 under vibration). In this case, it is preferable that the bottom of the coil 1 is fixed to the frame yoke on the fixed end side via a spacer or other part, and that the entirety of the frame yoke on the fixed end side is fixed.

Example 3

As shown in FIG. 26, four types of power generation elements A to D were manufactured, and the relationships between strain and magnetic flux were graphed. The width T of the frame yoke of each of the power generation elements A to D is 6 mm. As a permanent magnet for applying the magnetic bias, a neodymium magnet of 2×3×2 mm was used.

The power generation element A shown in FIGS. 26A1 and 26A2 includes the magnetic part and the magnetostrictive plate that are laminated. The magnetic part was magnetically saturated, and the parts other than the magnetic part in the frame yoke were not magnetically saturated. The width of the magnetic part is 2 mm.

The power generation element B shown in FIGS. 26B1 and 26B2 includes a frame yoke that is narrowed to the width of 2 mm, up to the bent part, so as to have the same width as the magnetic part. The magnetic part and the bent part were magnetically saturated.

The power generation element C shown in FIGS. 26C1 and 26C2 includes a frame yoke having a thickness that is twice the thickness of the frame yoke of the power generation element A and having a width that is narrowed to the width of 2 mm, up to the bent part, so as to have the same width as the magnetic part. The magnetic part and the bent part were not magnetically saturated.

The power generation element D shown in FIGS. 26D1 and 26D2 has the same shape as the power generation element A and includes a frame yoke that is formed with a non-magnetic material (SUS304). Considering that the frame yoke does not function as a magnetic circuit, permanent magnets were respectively arranged on both ends of the lamination part.

As discussed beforehand, the power generation element A is included in the present invention, whereas the power generation elements B to D are not included in the power generation element of the present invention and are comparative examples.

In the power generation elements A to D, the magnetostrictive plate is made of an Fe—Ga alloy and has measurements of 2×0.5×16 mm. In the power generation elements A and B, the frame yoke was fabricated from a SPCC plate having 0.5 mm thickness. In the power generation element C, the frame yoke was fabricated from a SPCC plate having 1 mm thickness. In the power generation element D, the frame yoke was fabricated from a plate made of SUS304.

A strain gauge was affixed on the center of the magnetostrictive plate of each of the power generation elements A to D. In the power generation elements A to C, the lamination part and the frame yoke on the fixed end side were respectively wound with single turn pickup coils 1 and 2. In the power generation element D, a single turn pickup coil was wound around the lamination part.

Figure 27B:
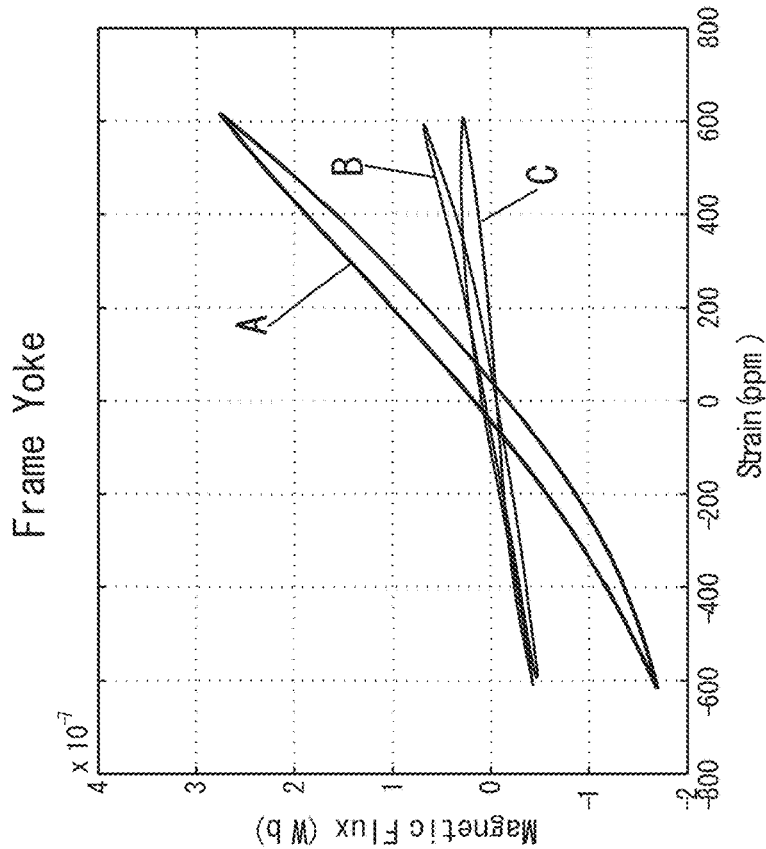
FIGS. 27A and 27B are graphs showing a relationship between strain and magnetic flux.
Figure 27A:
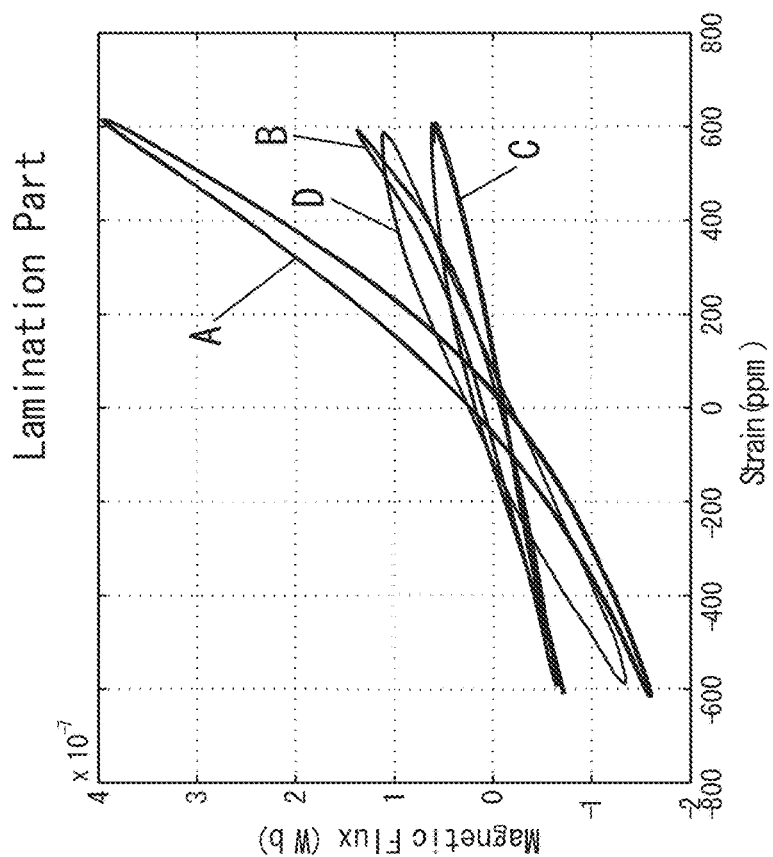

The frame yokes on the fixed end sides of the power generation elements A to D were fixed to a vibrator and were excited. At this time, the relationships between strain (deformation of the lamination part and the frame yoke) and variation in the magnetic flux were measured (FIGS. 27A and 27B).

In the lamination part of the power generation element A, the magnetic flux varied largely against the strain, compared with those in the power generation elements B to D. The variation in the magnetic flux occurred in the frame yoke on the fixed end side of the power generation element A, at a degree similar to that occurring in the lamination part.

The reason the variation in the magnetic flux in the power generation element B was significantly small in each of the lamination part and the frame yoke on the fixed end side is that: both the magnetic part and the neighboring bent part were magnetically saturated and did not function as a closed magnetic circuit.

The reason the variation in the magnetic flux in the power generation element C was significantly small in each of the lamination part and the frame yoke on the fixed end side is that: neither the magnetic part nor the magnetostrictive plate was in the magnetically saturated state, and thus, the variation in the magnetic flux in the magnetostrictive plate flowed back through the magnetic part to the magnetostrictive plate and formed a local closed magnetic circuit (as a whole, resultant variation in the magnetic flux to be observed was cancelled).

The reason the variation in the magnetic flux in the power generation element D was significantly small in each of the lamination part and the frame yoke on the fixed end side is that: the non-magnetic plate did not pass the magnetic flux and did not form a closed magnetic circuit.

The before-mentioned measurement shows the advantageous effects of the present invention.

Example 4

Figure 28:
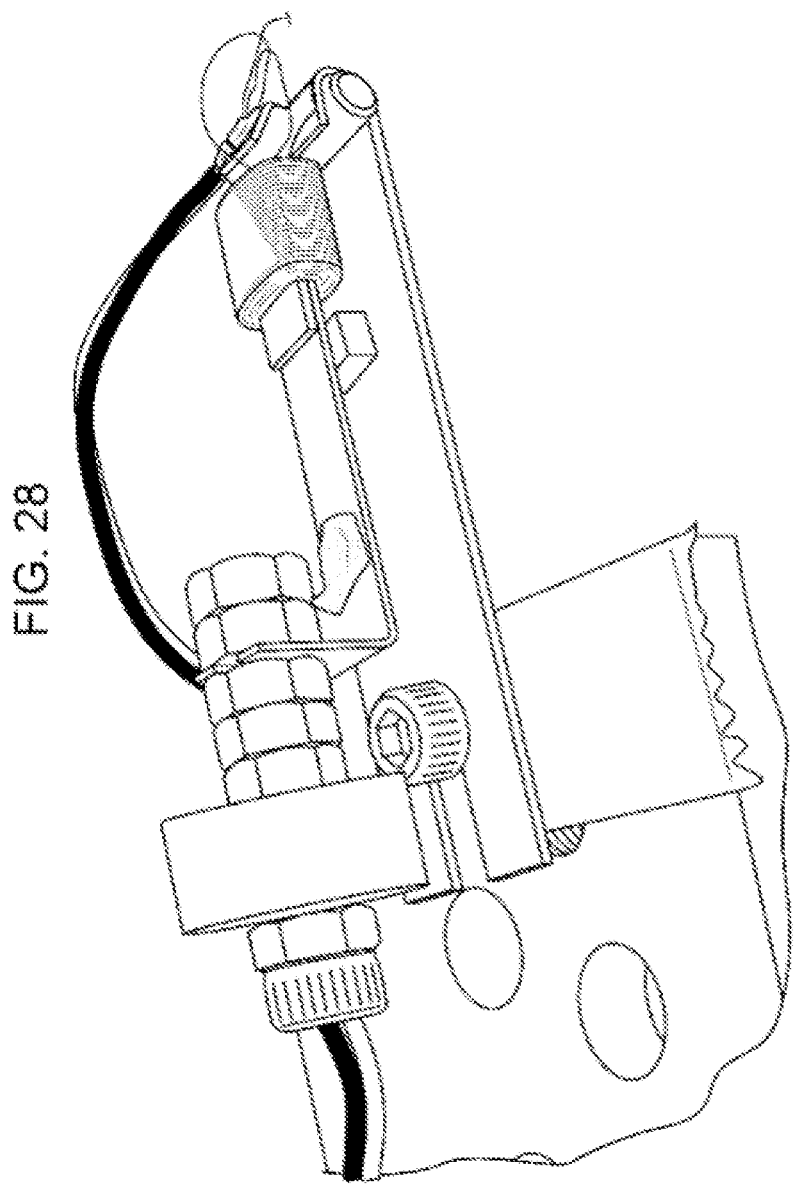
FIG. 28 is an image of a photograph showing a power generation element used in Example 4.
Figure 29:
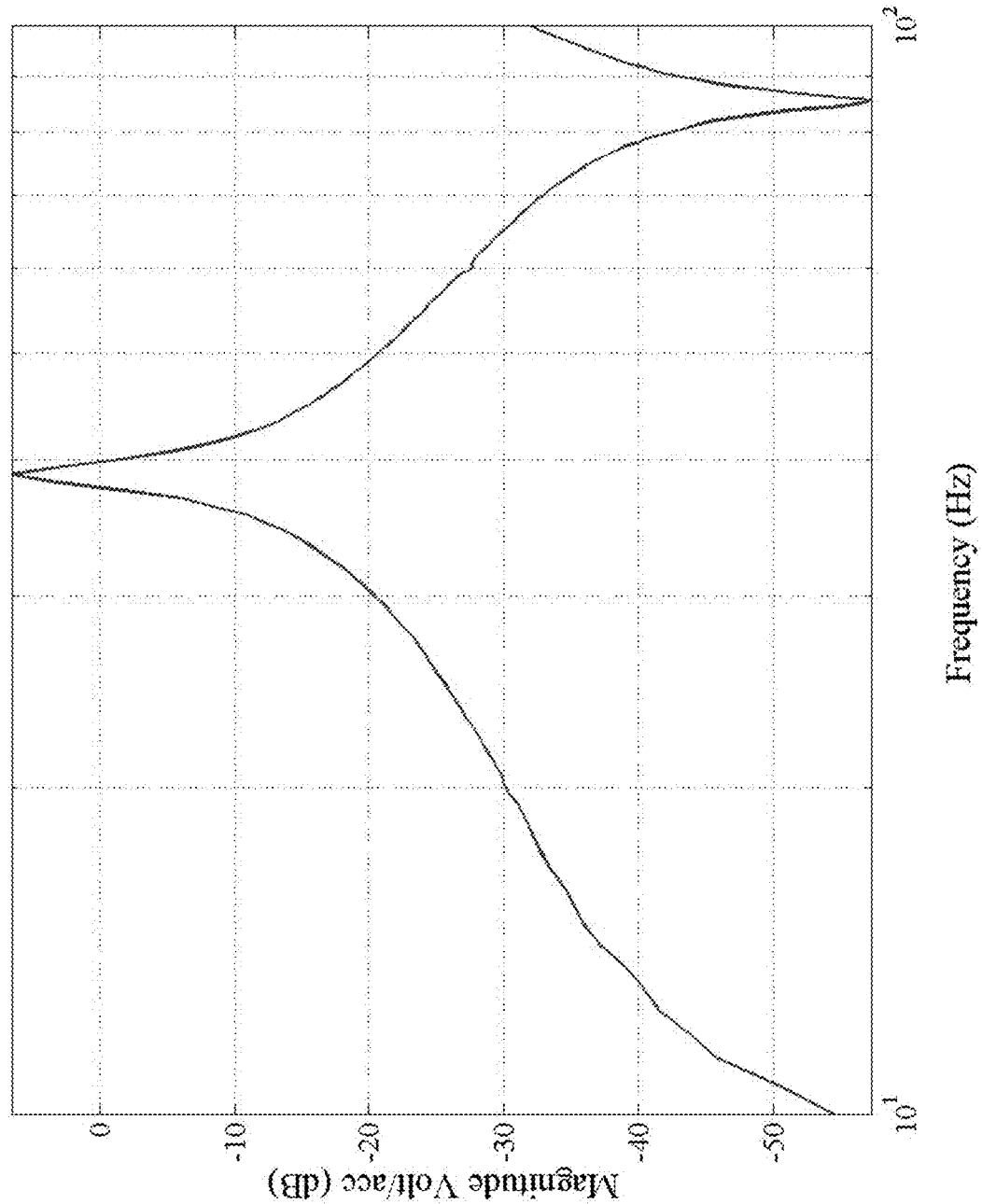
FIG. 29 is a graph showing a frequency response of voltage/vibration acceleration.
Figure 30:
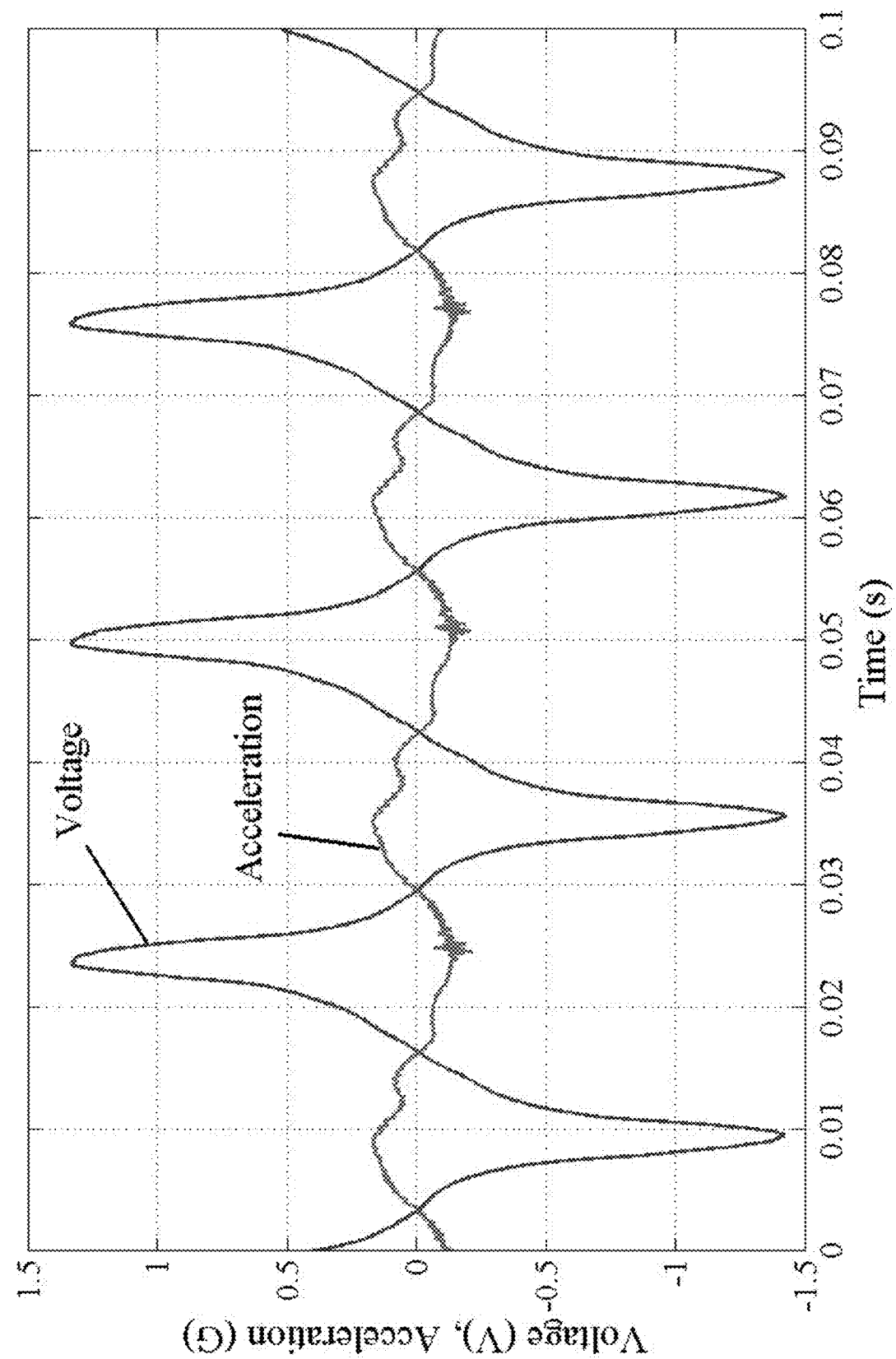
FIG. 30 is a graph showing time variations of voltage and moving acceleration.

The power generation element as shown in FIG. 28 was fabricated. Then, a frequency response graph of voltage/vibration acceleration as shown in FIG. 29 and a time variation graph for each of voltage and moving acceleration as shown in FIG. 30 were obtained.

Specifically, the magnetostrictive plate was formed with an Fe—Ga alloy to have 4 mm width, 0.5 mm thickness, and 13 mm length. The frame yoke was fabricated by using SPCC having 0.5 mm thickness so as to have 4 mm width at the magnetic part, which is the same as that of the magnetostrictive plate and have 12 mm width at the other part. The magnetic part was magnetically saturated, and the other parts were not magnetically saturated.

An empty core coil having 0.05 mm wire diameter, 2 mm layer thickness, 7 mm length, and 3456 turns was fitted to the lamination part from the back side and was fixed with silicon. As a bias permanent magnet, a neodymium magnet of 4×3×2 mm (thickness) was used.

A free end of the frame yoke was attached with a balance of 7 grams via an L-shaped metal fitting. The curvature radius of the bent part of the frame yoke is 1.5 mm, and an iron rod of 3 mm diameter was affixed on the inner surface of the bent part for suppressing deformation of the bent part.

The tip of the fixing end of the frame yoke was fixed by a screw, and the frame yoke was vibrated using a vibrator.

As shown in FIG. 29, in the frequency response of the voltage/vibration acceleration (measured by an acceleration pickup), a resonance frequency was seen at 38.2 Hz, and sharp resonance (high Q value) was shown.

Then, the frame yoke was vibrated with a sine wave of 38.2 Hz at 0.1 G, an open voltage of up to 1.34 V was generated as shown in FIG. 30. Considering that the resistance of the coil is 400Ω, the generated power is 1.12 mW, which is calculated by dividing a "square of open voltage" by the "quadruple of resistance".

As previously discussed, a vibration power generation device was successfully developed that can provide a sufficiently practical voltage or power to a wireless sensor system to enable self-powered operation, even with a small acceleration of approximately 30 Hz and 0.1 G, which may arise on a bridge, automobile engine, compressor, and manufacturing machines.

In this example, a cold-rolled material was used as the plate material of the frame yoke. However, a bainite steel or an SK material that has high spring characteristics may be used to reduce a mechanical loss of the frame yoke, thereby further increasing sensitivity.

Example 5

Figure 31:
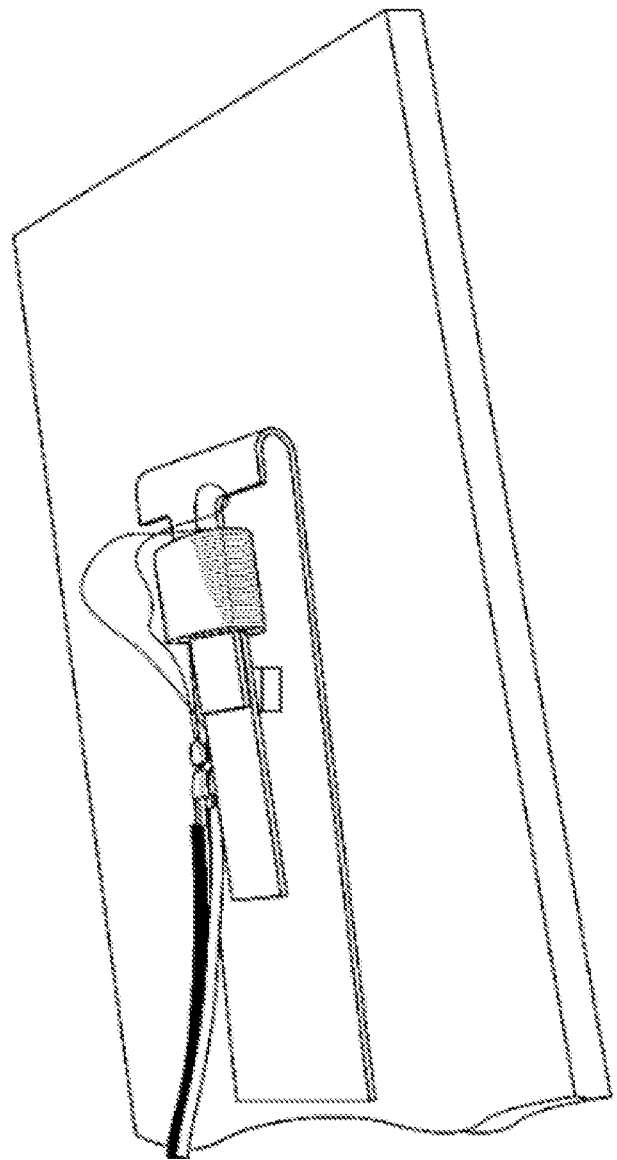
FIG. 31 is an image of a photograph showing a power generation element used in Example 5.

The power generation element as shown in FIG. 31 was fabricated. This power generation element has a structure almost the same as that of the power generation element in FIG. 28. The difference is that the balance was not provided in the free end side to increase the resonance frequency, and that the iron rod was not provided in the inner surface side of the bent part.

Figure 32:
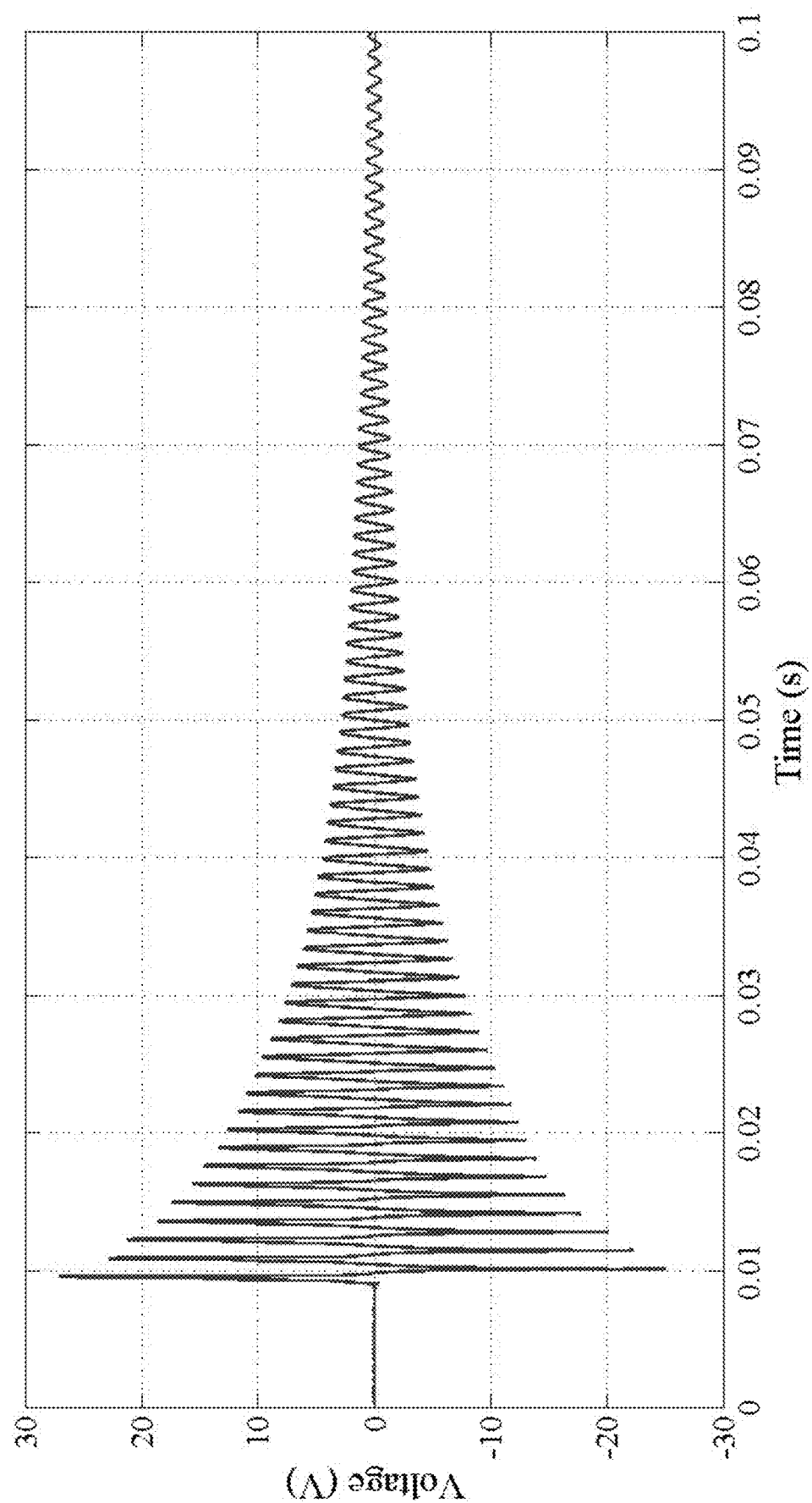
FIG. 32 is a graph showing a time variation of generated voltage.
Figure 33A:
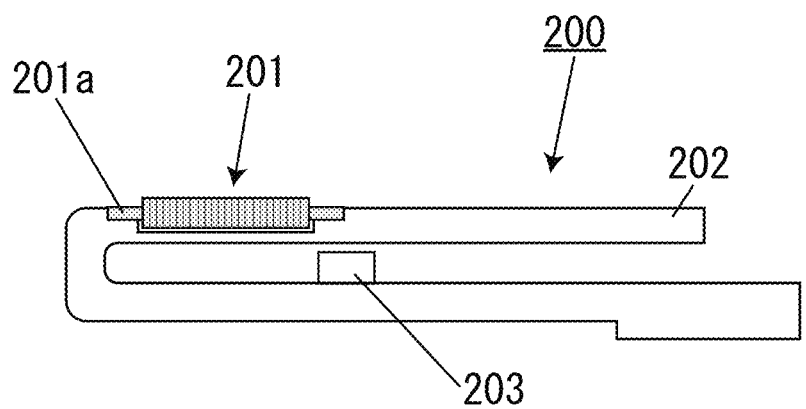
FIG. 33A is a side view of a conventional power generation element.
Figure 33B:
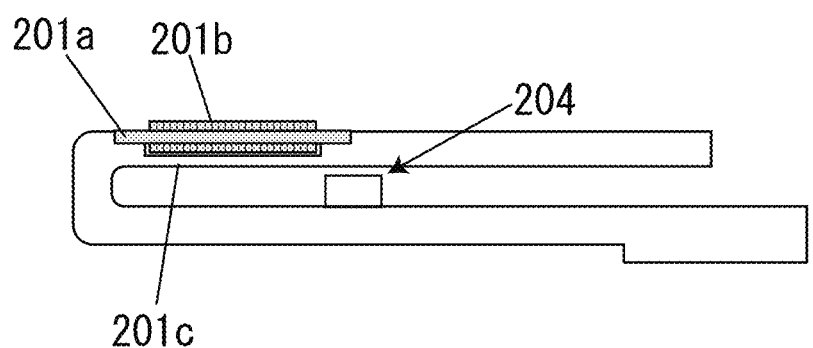
FIG. 33B is the side view in which a part of a coil is omitted for ease of understanding the structure of a parallel beam part.
Figure 34:
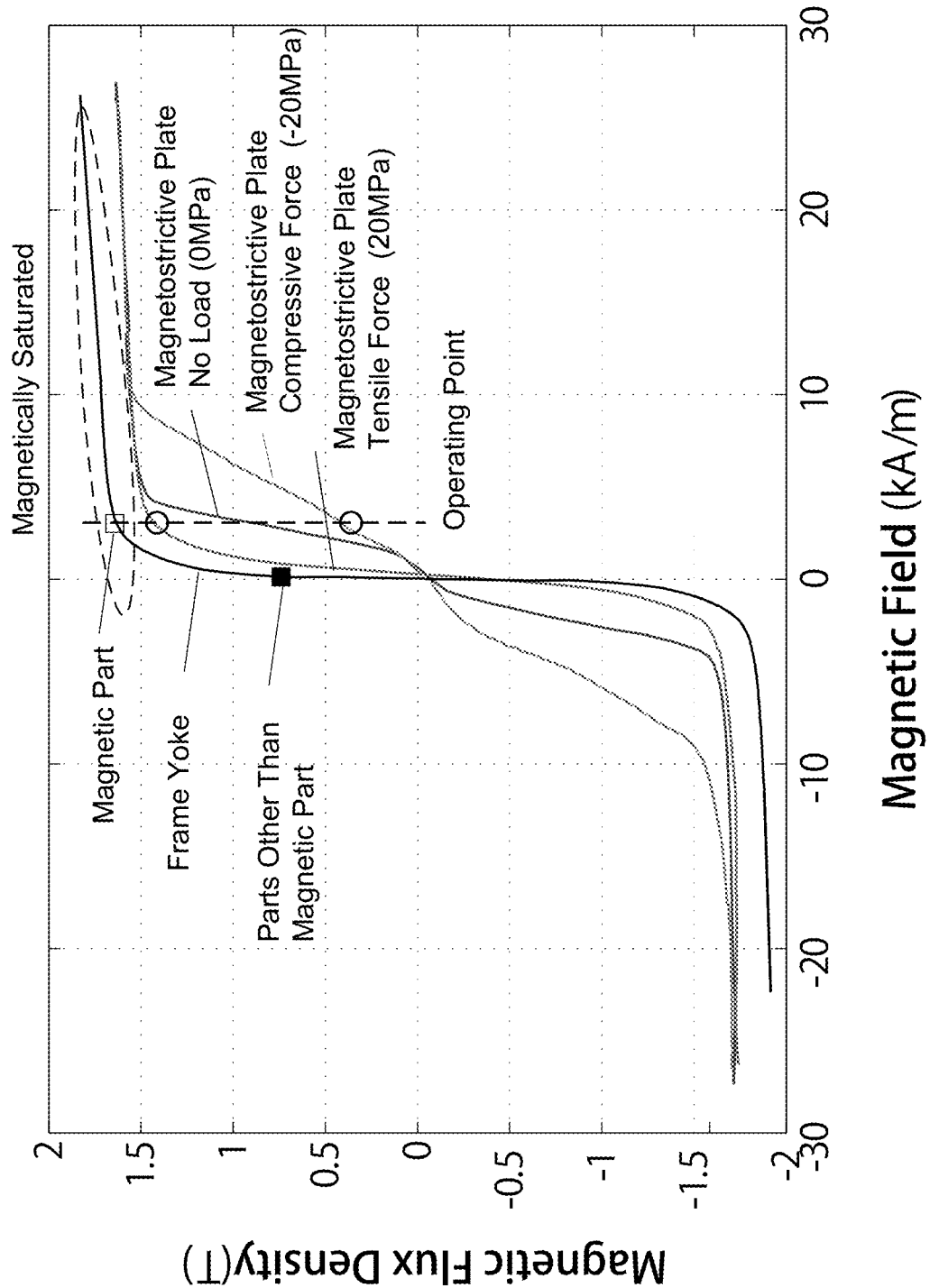
FIG. 34 is a graph showing magnetization curves of a magnetostrictive plate and a frame yoke.

The power generation element on the fixed end side was fixed with a screw to an acrylic plate simulating a remote controller casing. When the acrylic plate was held by hand, and the tip was flipped with a finger (fingernail), the power generation element was vibrated freely. As a result, an open voltage of up to 27 V that freely oscillates at 769 Hz was generated as shown in FIG. 32. The vibration lasted for about 0.1 seconds. When the frame yoke is formed in a U-shape and includes the lamination part, vibration continues.

The generated energy was 1.8 mJ, which was obtained by squaring the voltage, performing time integrating of the squared voltage, and then dividing the resultant value by resistance. This value far exceeds the energy necessary for a remote controller to make a single wireless transmit, which is 0.2 mJ.

This power generation element was attached with a double voltage rectifier circuit and a capacitor for rectifying the voltage, and then this power generation element was supplied to a wireless module for a remote controller (IM315TX: manufactured by Interplan Co., Ltd.). As a result, the module operated each time the tip was flipped, and the signal transmission was successful.

As discussed beforehand, a remote controller that does not need a battery was successfully developed.

INDUSTRIAL APPLICABILITY

The present invention relates to the power generation element using the inverse magnetostrictive effect, the method for manufacturing the power generation element, and an actuator, each of which provides an increased electromotive force and enables decreasing manufacturing cost and mass production. The invention is therefore applicable to the industry.

REFERENCE SIGN LIST 1-12 power generation element
20 magnetostrictive plate
30 frame yoke
30a first component
30b second component
31 magnetic part
32 first component
33 second component
34 third component
35 rod-shaped component
36 bent component
40 back yoke
50 magnet
51 electromagnet
60 coil
60a coil
70 balance, vibration plate
71 vibration source
72 metal fittings
73 magnet
74 switch plate
80 parallel beam part
90 gap
100 power generation element
101 pickup coil
102 frame yoke
103 back yoke
104 balance
105 parallel beam part
106 vibration source
107 magnetostrictive plate
108 magnetic part
109 magnet
110 gap
200 bent part
201 magnetic part
202 lamination part
203 frame yoke
204 circuit element
205 frame yoke
205a plate component
205b bent component
205c plate component
205d connection part
205e plate component
206 frame yoke
207 switch mechanism
207a switch plate
207b yoke
207c operation part

The invention claimed is:

1. A power generation element using an inverse magnetostrictive effect, the power generation element comprising: a frame yoke made of a magnetic material and having a bent part for forming a closed magnetic circuit; a magnetic part formed in a part of the frame yoke; a magnetostrictive plate made of a magnetostrictive material; a coil; and a magnet, wherein
the magnetic part has rigidity and geometry for applying a uniform compressive force or tensile force to the magnetostrictive plate and is magnetically saturated by magnetic biases of the magnets,
the magnetostrictive plate is attached to the frame yoke so as to be parallel to the magnetic part,
the coil is wound around a parallel beam part including the magnetostrictive plate and the magnetic part and/or around the frame yoke, and
the magnetostrictive plate is extended and compressed by an applied external force and causes the generation of electricity.

2. The power generation element as claimed in claim 1, wherein
the parallel beam part includes a lamination part that is constituted by laminating the magnetostrictive plates on the surface of the magnetic part.

3. The power generation element as claimed in claim 1, comprising:
a back yoke formed in a channel shape; and
another magnet, in addition to the magnet, wherein
the magnets are respectively attached to both ends of the back yoke, and
the back yoke is supported by the frame yoke such that each of the magnets is positioned leaving a gap from the side surface of the frame yoke and that the magnets sandwich the frame yoke therebetween.

4. The power generation element as claimed in claim 3, wherein
the width of the frame yoke at a part that is sandwiched by the magnets is varied spatially, and the distance of the gap varies in accordance with movement of the frame yoke.

5. The power generation element as claimed in claim 1, wherein
the coil is fixed to the frame yoke on a side of a fixed end such that a gap is maintained between an inside of an empty core of the coil and the parallel beam part.

6. The power generation element as claimed in claim 1, wherein
the frame yoke is constituted by joining two or more components.

7. The power generation element as claimed in claim 1, wherein
a part of the frame yoke is narrowed in the width direction and/or thinned in the thickness direction, and
the narrowed and/or thinned part is used as the magnetic part.

8. The power generation element as claimed in claim 1, wherein
the magnetic part has the same width as the magnetostrictive plate, and
a part of the frame yoke, which is other than the magnetic part and functions as a magnetic path of the closed magnetic circuit, has two times or more of the width of the magnetic part.

9. The power generation element as claimed in claim 1, wherein
the frame yoke includes two or more free ends and the fixed end, and
the parallel beam part is provided in a side of each of the one or more free ends.

10. The power generation element as claimed in claim 1, wherein
the magnet is an electromagnet.

11. The power generation element as claimed in claim 1, comprising:
a switch mechanism for applying an external force that is provided on a part of the frame yoke.

12. A method for manufacturing the power generation element as claimed in claim 1, wherein
the frame yoke is manufactured by plastic processing.

13. The method for manufacturing the power generation element as claimed in claim 12, wherein
the frame yoke is fabricated in a channel shape by bending.

14. The method for manufacturing the power generation element as claimed in claim 1, wherein
the coil is fixed after the coil is fitted from an end part of the frame yoke and is moved to the parallel beam part.

15. An actuator comprising the power generation element as claimed in claim 1, wherein
the magnetostrictive plate is extended and compressed by an application of current to the coil, thereby vibrating the free end of the frame yoke.

\* \* \* \* \*